(12) United States Patent
Sasagawa et al.

(10) Patent No.: US 8,575,608 B2
(45) Date of Patent: Nov. 5, 2013

(54) THIN FILM TRANSISTOR AND MANUFACTURING METHOD THEREOF

(75) Inventors: Shinya Sasagawa, Kanagawa (JP);
Akihiro Ishizuka, Kanagawa (JP);
Shinobu Furukawa, Kanagawa (JP);
Motomu Kurata, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 318 days.

(21) Appl. No.: 12/973,123

(22) Filed: Dec. 20, 2010

(65) Prior Publication Data

US 2011/0147745 A1    Jun. 23, 2011

(30) Foreign Application Priority Data

Dec. 21, 2009  (JP) ................. 2009-289802

(51) Int. Cl.
*H01L 29/786* (2006.01)
(52) U.S. Cl.
USPC .......... 257/57; 257/64; 257/52; 257/E29.068; 438/158
(58) Field of Classification Search
USPC ................................ 257/43, 59, 72
See application file for complete search history.

(56) References Cited

U.S. PATENT DOCUMENTS

| | | | |
|---|---|---|---|
| 4,242,156 A | 12/1980 | Peel | |
| 4,409,134 A | 10/1983 | Yamazaki | |
| 4,581,620 A | 4/1986 | Yamazaki et al. | |
| 5,101,242 A | 3/1992 | Ikeda et al. | |
| 5,221,631 A | 6/1993 | Ikeda et al. | |
| 5,262,654 A | 11/1993 | Yamazaki | |
| RE34,658 E | 7/1994 | Yamazaki et al. | |
| 5,414,442 A | 5/1995 | Yamazaki et al. | |
| 5,453,858 A | 9/1995 | Yamazaki | |
| 5,514,879 A | 5/1996 | Yamazaki | |
| 5,571,578 A | 11/1996 | Kaji et al. | |

(Continued)

FOREIGN PATENT DOCUMENTS

| | | |
|---|---|---|
| DE | 1 973 6204 B4 | 2/1998 |
| DE | 197 36 20 154 | 2/1998 |

(Continued)

OTHER PUBLICATIONS

Kim.C et al., "A Novel Four-Mask-Count Process Architecture for TFT-LCDS,", SID Digest '00 : SID International Symposium Digest of Technical Papers, 2000, vol. 31, pp. 1006-1009.

(Continued)

*Primary Examiner* — Matthew W Such
*Assistant Examiner* — Scott Stowe
(74) *Attorney, Agent, or Firm* — Nixon Peabody LLP; Jeffrey L. Costellia

(57) ABSTRACT

An embodiment is a thin film transistor which includes a gate electrode layer, a gate insulating layer provided so as to cover the gate electrode layer; a first semiconductor layer entirely overlapped with the gate electrode layer; a second semiconductor layer provided over and in contact with the first semiconductor layer and having a lower carrier mobility than the first semiconductor layer; an impurity semiconductor layer provided in contact with the second semiconductor layer; a sidewall insulating layer provided so as to cover at least a sidewall of the first semiconductor layer; and a source and drain electrode layers provided in contact with at least the impurity semiconductor layer. The second semiconductor layer may consist of parts which are apart from each other over the first semiconductor layer.

22 Claims, 17 Drawing Sheets

(56) References Cited

U.S. PATENT DOCUMENTS

| | | | |
|---|---|---|---|
| 5,591,987 A | 1/1997 | Yamazaki et al. |
| 5,614,732 A | 3/1997 | Yamazaki |
| 5,648,662 A | 7/1997 | Zhang et al. |
| 5,650,339 A | 7/1997 | Saito et al. |
| 5,652,453 A | 7/1997 | Iwamatsu et al. |
| 5,656,825 A | 8/1997 | Kusumoto et al. |
| 5,677,236 A | 10/1997 | Saitoh et al. |
| 5,701,167 A | 12/1997 | Yamazaki |
| 5,728,259 A | 3/1998 | Suzawa et al. |
| 5,766,989 A | 6/1998 | Maegawa et al. |
| 5,773,330 A | 6/1998 | Park |
| 5,835,172 A | 11/1998 | Yeo et al. |
| 5,849,601 A | 12/1998 | Yamazaki |
| 5,859,445 A | 1/1999 | Yamazaki |
| 5,864,150 A | 1/1999 | Lin |
| 5,932,302 A | 8/1999 | Yamazaki et al. |
| 5,989,998 A | 11/1999 | Sugahara et al. |
| 6,010,922 A | 1/2000 | Hata et al. |
| 6,011,277 A | 1/2000 | Yamazaki |
| 6,013,930 A | 1/2000 | Yamazaki et al. |
| 6,023,075 A | 2/2000 | Yamazaki |
| 6,030,873 A | 2/2000 | Iwamatsu et al. |
| 6,087,698 A | 7/2000 | Saito et al. |
| 6,091,467 A | 7/2000 | Kubo et al. |
| 6,100,558 A | 8/2000 | Krivokapic et al. |
| 6,104,065 A | 8/2000 | Park |
| 6,121,660 A | 9/2000 | Yamazaki et al. |
| 6,153,893 A | 11/2000 | Inoue et al. |
| 6,171,674 B1 | 1/2001 | Yamazaki et al. |
| 6,183,816 B1 | 2/2001 | Yamazaki et al. |
| 6,218,219 B1 | 4/2001 | Yamazaki et al. |
| 6,252,249 B1 | 6/2001 | Yamazaki |
| 6,281,520 B1 | 8/2001 | Yamazaki |
| 6,306,213 B1 | 10/2001 | Yamazaki |
| 6,387,737 B1 | 5/2002 | Yamazaki et al. |
| 6,388,291 B1 | 5/2002 | Zhang et al. |
| 6,426,245 B1 | 7/2002 | Kawasaki et al. |
| 6,433,361 B1 | 8/2002 | Zhang et al. |
| 6,468,617 B1 | 10/2002 | Yamazaki et al. |
| 6,468,839 B2 | 10/2002 | Inoue et al. |
| 6,498,369 B1 | 12/2002 | Yamazaki et al. |
| 6,555,843 B1 | 4/2003 | Yamazaki et al. |
| 6,558,756 B2 | 5/2003 | Sugahara et al. |
| 6,559,548 B1 | 5/2003 | Matsunaga et al. |
| 6,693,044 B1 | 2/2004 | Yamazaki et al. |
| 6,737,676 B2 | 5/2004 | Yamazaki |
| 6,744,008 B1 | 6/2004 | Kasahara et al. |
| 6,756,258 B2 | 6/2004 | Zhang et al. |
| 6,835,523 B1 | 12/2004 | Yamazaki et al. |
| 6,864,583 B2 | 3/2005 | Matsunaga et al. |
| 6,876,039 B2 | 4/2005 | Okihara |
| 7,060,323 B2 | 6/2006 | Sugahara et al. |
| 7,067,844 B2 | 6/2006 | Yamazaki |
| 7,067,845 B2 | 6/2006 | Murakami et al. |
| 7,098,479 B1 | 8/2006 | Yamazaki |
| 7,102,718 B1 | 9/2006 | Yamazaki et al. |
| 7,115,902 B1 | 10/2006 | Yamazaki |
| 7,115,903 B2 | 10/2006 | Isobe et al. |
| 7,157,358 B2 | 1/2007 | Hall et al. |
| 7,164,171 B2 | 1/2007 | Yamazaki et al. |
| 7,183,211 B2 | 2/2007 | Konno et al. |
| 7,199,846 B2 | 4/2007 | Lim |
| 7,259,429 B2 | 8/2007 | Yamazaki |
| 7,365,805 B2 | 4/2008 | Maekawa et al. |
| 2002/0009890 A1 | 1/2002 | Hayase et al. |
| 2002/0055209 A1 | 5/2002 | Kusumoto et al. |
| 2004/0026696 A1 | 2/2004 | Yamazaki et al. |
| 2004/0113214 A1 | 6/2004 | Takenaka |
| 2004/0206956 A1 | 10/2004 | Yanai et al. |
| 2005/0012097 A1 | 1/2005 | Yamazaki |
| 2005/0012151 A1 | 1/2005 | Yamaguchi et al. |
| 2005/0022864 A1 | 2/2005 | Fujioka et al. |
| 2005/0062129 A1 | 3/2005 | Komatsubara |
| 2005/0115930 A1 | 6/2005 | Tanaka et al. |
| 2005/0116305 A1 | 6/2005 | Hwang et al. |
| 2006/0049449 A1 | 3/2006 | Iino et al. |
| 2006/0113894 A1 | 6/2006 | Fujii et al. |
| 2007/0034871 A1 | 2/2007 | Itoh et al. |
| 2007/0045627 A1 | 3/2007 | Park et al. |
| 2007/0080374 A1 | 4/2007 | Kurokawa |
| 2007/0123035 A1 | 5/2007 | Sugimoto et al. |
| 2007/0176176 A1 | 8/2007 | Yamazaki et al. |
| 2007/0181945 A1 | 8/2007 | Nakamura |
| 2007/0252179 A1 | 11/2007 | Isobe et al. |
| 2007/0281400 A1 | 12/2007 | Yamazaki et al. |
| 2008/0128703 A1 | 6/2008 | Ikeda et al. |
| 2008/0128808 A1 | 6/2008 | Yamazaki et al. |
| 2008/0132066 A1 | 6/2008 | Phan et al. |
| 2009/0001375 A1 | 1/2009 | Yamazaki et al. |
| 2009/0002591 A1 | 1/2009 | Yamazaki et al. |
| 2009/0026454 A1 | 1/2009 | Kurokawa et al. |
| 2009/0033818 A1 | 2/2009 | Nakajima et al. |
| 2009/0045409 A1 | 2/2009 | Yamazaki et al. |
| 2009/0047775 A1 | 2/2009 | Yamazaki et al. |
| 2009/0057683 A1 | 3/2009 | Nakajima et al. |
| 2009/0061574 A1 | 3/2009 | Nakajima et al. |
| 2009/0140250 A1* | 6/2009 | Yamazaki et al. ............... 257/57 |
| 2009/0152550 A1* | 6/2009 | Ohnuma et al. ................ 257/57 |
| 2009/0321737 A1 | 12/2009 | Isa et al. |
| 2010/0301346 A1 | 12/2010 | Miyairi et al. |
| 2011/0147755 A1 | 6/2011 | Miyairi et al. |

FOREIGN PATENT DOCUMENTS

| | | |
|---|---|---|
| EP | 0 532 314 A1 | 3/1993 |
| EP | 0 535 979 A2 | 4/1993 |
| EP | 0 826 791 A2 | 3/1998 |
| EP | 1 045 447 A2 | 10/2000 |
| EP | 1 050 599 A2 | 11/2000 |
| EP | 1 182 275 A2 | 2/2002 |
| EP | 1 207 217 A1 | 5/2002 |
| EP | 1 333 476 A2 | 8/2003 |
| EP | 1 536 482 A1 | 6/2005 |
| JP | 57-071126 | 5/1982 |
| JP | 58-092217 | 6/1983 |
| JP | 59-072781 | 4/1984 |
| JP | 59-150469 | 8/1984 |
| JP | 01-117068 | 5/1989 |
| JP | 04-242724 | 8/1992 |
| JP | 04-266019 | 9/1992 |
| JP | 05-129608 | 5/1993 |
| JP | 06-037313 | 2/1994 |
| JP | 06-326312 | 11/1994 |
| JP | 07-131030 | 5/1995 |
| JP | 07-176753 | 7/1995 |
| JP | 07-211708 | 8/1995 |
| JP | 07-335906 | 12/1995 |
| JP | 08-018055 | 1/1996 |
| JP | 08-125195 | 5/1996 |
| JP | 08-153699 | 6/1996 |
| JP | 08-335702 | 12/1996 |
| JP | 09-023010 | 1/1997 |
| JP | 10-020298 | 1/1998 |
| JP | 11-121761 | 4/1999 |
| JP | 11-258636 | 9/1999 |
| JP | 2000-277439 | 10/2000 |
| JP | 2001-007024 | 1/2001 |
| JP | 2001-053283 | 2/2001 |
| JP | 3474286 | 12/2003 |
| JP | 2004-014958 | 1/2004 |
| JP | 2005-019659 | 1/2005 |
| JP | 2005-049832 | 2/2005 |
| JP | 2005-167051 | 6/2005 |
| JP | 2005-167207 | 6/2005 |
| JP | 2005-183774 | 7/2005 |
| JP | 2005-191546 | 7/2005 |
| JP | 2008-124392 | 5/2008 |
| JP | 2009-044134 | 2/2009 |
| WO | WO 2004/086487 A1 | 10/2004 |

OTHER PUBLICATIONS

Fujiwara.H et al., "Real-time spectroscopic ellipsometry studies of the nucleation and grain growth processes in microcrystalline silicon

(56) References Cited

OTHER PUBLICATIONS thin films,", Phys. Rev. B (Physical Review. B), Feb. 23, 2001, vol. 83, pp. 115306-1-115306-9.

Arai.T et al., "41.2: Micro Silicon Technology for Active Matrix Oled Display,", SID Digest '07 : SID International Symposium Digest of Technical Papers, 2007, vol. 38, pp. 1370-1373.

Fujiwara.H et al., "Microcrystalline silicon nucleation sites in the sub-surface of hydrogenated amorphous silicon,", Surface Science, 2002, vol. 497, No. 1-3, pp. 333-340.

Fujiwara.H et al., "Stress-Induced Nucleation of Microcrystalline Silicon from Amorphous Phase,", Jpn. J. Appl. Phys. (Japanese Journal of Applied Physics) , May 15, 2002, vol. 41, Part 1, No. 5A, pp. 2821-2828.

Kamei.T et al., "A Significant Reduction-Impurity Contents in Hydrogenated Microcrystalline Silicon Films for Increased Grain Size and Reduced Defect Density,", Jpn. J. Appl. Phys. (Japanese Journal of Applied Physics), Mar. 1, 1996, Part 2, vol. 37, No. 3A, pp. L265-L268.

Lee.C et al., "How to Achieve High Mobility Thin Film Transistors by Direct Deposition of Silicon Using 13.56 MHZ RF PECVD?,", IEDM 06: Technical Digest of International Electron Devices Meeting, Dec. 11, 2006, pp. 295-298.

Lee.C et al., "Directly Deposited Nanocrystalline Silicon Thin-Film Transistors With Ultra High Mobilities,", Appl. Phys. Lett. (Applied Physics Letters) , Dec. 18, 2006, vol. 89, No. 25, pp. 252101-1-252101-3.

Song.J et al., "34.1: Advanced Four-Mask Process Architecture for the A-Si TFT Array Manufacturing Method,", SID Digest '02 : SID International Symposium Digest of Technical Papers, 2002, vol. 32, pp. 1038-1041.

Choi.S et al., "P-16: Novel Four-Mask Process in the FFS TFT-LCD With Optimum Multiple-Slit Design Applied by the Use of a Gray-Tone Mask,", SID Digest '05 : SID International Symposium Digest of Technical Papers, 2005, vol. 36, pp. 284-287.

Lee.C et al., "High-Mobility Nanocrystalline Silicon Thin-Film Transistors Fabricated by Plasma-Enhanced Chemical Vapor Deposition,", Appl. Phys. Lett. (Applied Physics Letters) , May 24, 2005, vol. 86, pp. 222106-1-222105-3.

Lee.C et al., "High-Mobility N-Channel and F-Channel Nanocrystalline Silicon Thin-Film Transistors,", IEDM 05: Technical Digest of International Electron Devices Meeting, 2005, pp. 937-940.

Esmaeili-Rad.M et al., "High Stability, Low Leakage Nanocrystalline Silicon Bottom Gate Thin Film Transistors for Amoled Displays,", IEDM 06: Technical Digest of International Electron Devices Meeting, 2006, pp. 303-306.

Lee.H et al., "Leakage Current Mechanisms in Top-Gate Nanocrystalline Silicon Thin-Film Transistors,", Appl. Phys. Lett. (Applied Physics Letters) , Feb. 28, 2008, vol. 92, pp. 083509-1-083509-3.

Esmaeili-Rad.M et al., "Absence of Defect State Creation in Nanocrystalline Silicon Thin-Film Transistors Deduced From Constant Current Stress Measurements", Appl. Phys. Lett. (Applied Physics Letters) , Sep. 12, 2007, vol. 91, No. 11, pp. 113511-1-113511-3.

Lee.C et al., "Stability of NC-SI:H TFTS With Silicon Nitride Gate Dielectric,", IEEE Transactions on Electron Devices, 2007, vol. 54, No. 1, pp. 45-51.

Sazonov.A et al., "Low-Temperature Materials and Thin Film Transistors for Flexible Electronics,", Proceedings of the IEEE, Aug. 1, 2005, vol. 93, No. 8, pp. 1420-1428.

Esmaeili-Rad.M et al., "Stability of Nanocrystalline Silicon Bottom-Gate Thin-Film Transistors with Silicon Nitride Gate Dielectric,", J. Appl. Phys. (Journal of Applied Physics) , Sep. 28, 2007, vol. 102, No. 6, pp. 064512-1-064512-7.

Lee.C et al., "Top-Gate TFTS Using 13.56MHZ PECVD Microcrystalline Silicon,", IEEE Electron Device Letters, Sep. 5, 2005, vol. 26, No. 9, pp. 637-639.

Lee.C et al., "Postdeposition Thermal Annealing and Material Stability of 75° C. Hydrogenated Nanocrystalline Silicon Plasma-Enhanced Chemical Vapor Deposition Films ,", J. Appl. Phys. (Journal of Applied Physics ) , Aug. 4, 2005, vol. 98, No. 3, pp. 034305-1-034305-7.

\* cited by examiner

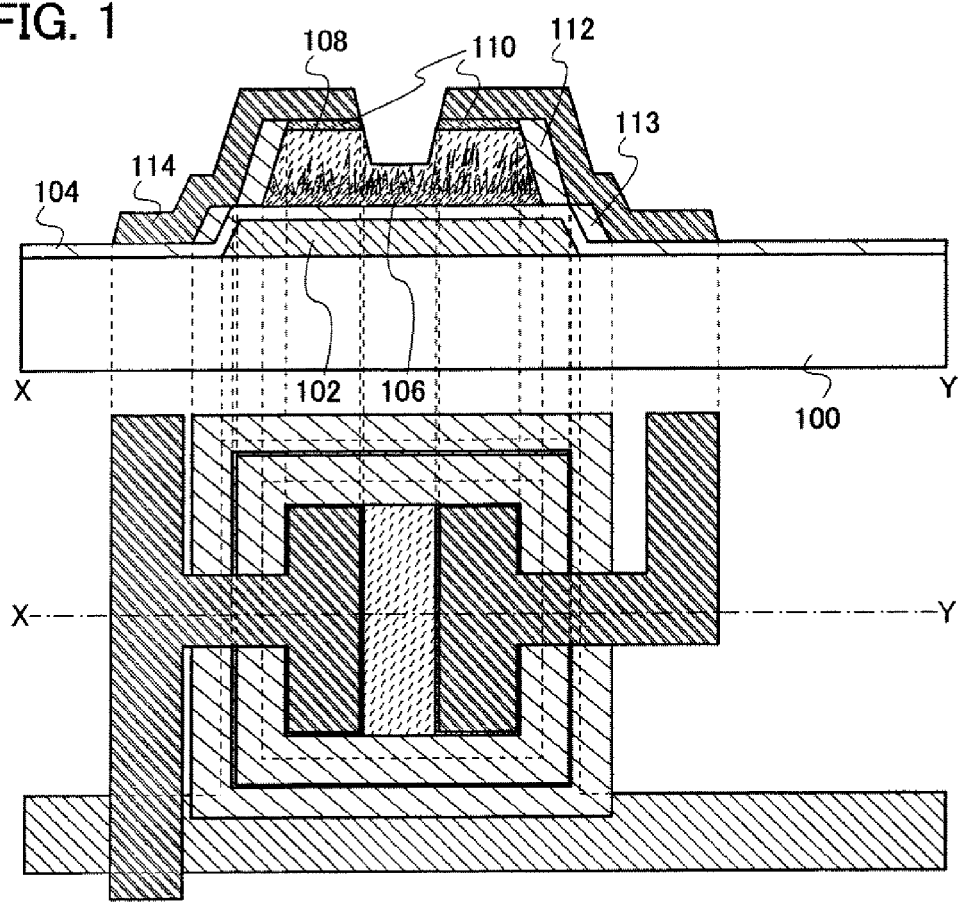

FIG. 17A
FIG. 17B
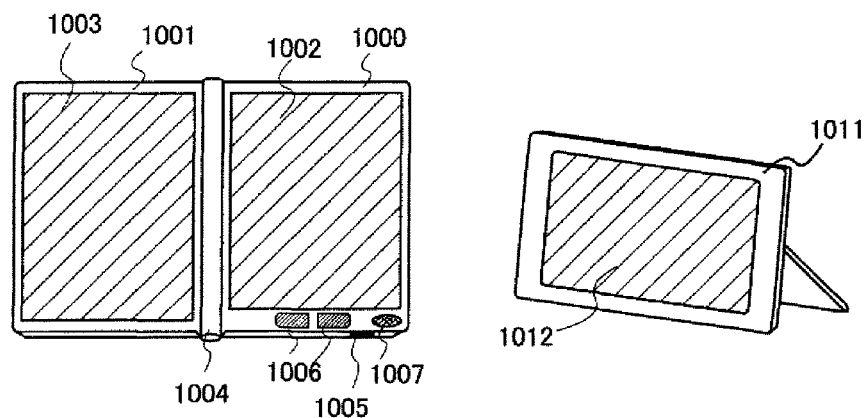
FIG. 17C
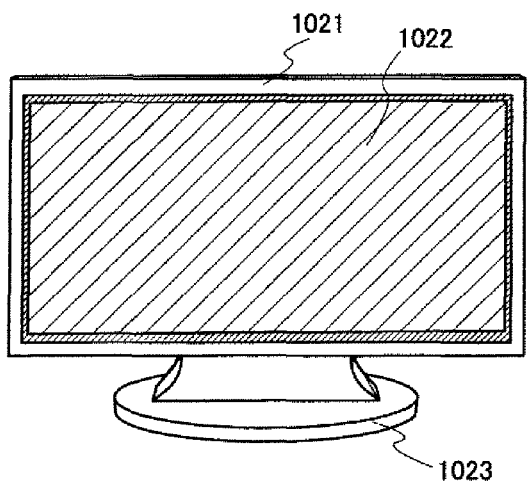
FIG. 17D
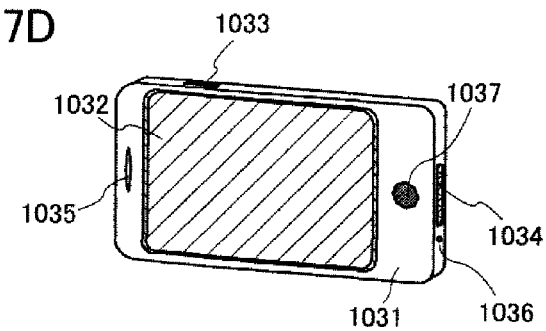

THIN FILM TRANSISTOR AND MANUFACTURING METHOD THEREOF

BACKGROUND OF THE INVENTION

1. Field of the Invention

The present invention relates to a thin film transistor and a manufacturing method thereof. Further, the present invention relates to a display device and an electronic device which include the thin film transistor and to which the manufacturing method of the thin film transistor can be applied.

2. Description of the Related Art

In recent years, thin film transistors (TFTs) each including a thin semiconductor film (with a thickness of approximately several nanometers to several hundreds of nanometers) over a substrate having an insulating surface (e.g., a glass substrate) have been attracting attention. The development of TFTs, for example, as switching elements of a display device such as a liquid crystal display device and the like has been accelerated. For such TFTs, an amorphous semiconductor or a polycrystalline semiconductor is mainly used. In addition, TFTs in which a microcrystalline semiconductor is used are also known (e.g., Patent Document 1). In a display device, switching characteristics of the mounted TFTs have an influence on display quality, power consumption, and the like.

One of the parameters that determine switching characteristics of a TFT is an on/off ratio of current. The on/off ratio of current can be increased by increasing on-state current and reducing off-state current.

In this specification, the "on/off ratio" refers to a ratio of on-state current to off-state current in a transistor. Note that the "off-state current" refers to drain current at the time when the TFT is OFF while the "on-state current" refers to current flowing between the source and the drain when the TFT is ON. Further, in this specification, the "drain current" refers to current flowing between the source and the drain.

As a path of the off-state current, a path that is from one of the source electrode and the drain electrode to the other thereof through a semiconductor layer can be given. This off-state current can be reduced by provision of a sidewall insulating layer that is in contact with a sidewall of the semiconductor layer (e.g., Patent Document 2).

However, a favorable TFT cannot be obtained only by realizing a high on/off ratio. For example, it is also important to reduce light-induced leakage current. Here, light-induced leakage current refers to current which flows between the source and the drain due to a photovoltaic effect when light reaches a semiconductor layer of the TFT. Particularly, since a TFT which is used as a pixel transistor of a liquid crystal display device receives light from a backlight on a substrate side, light-induced leakage current should be sufficiently small. For this reason, there have been a lot of developments in a technique for shielding the semiconductor layer of the TFT from light (see Patent Document 3, for example).

REFERENCE

Patent Document

[Patent Document 1] Japanese Published Patent Application No. 2009-044134
[Patent Document 2] Japanese Published Patent Application No. H01-117068
[Patent Document 3] Japanese Published Patent Application No. H10-020298

SUMMARY OF THE INVENTION

It is an object of an embodiment of the present invention to provide a TFT which has a high on/off ratio and whose light-induced leakage current is small.

Further, it is an object of an embodiment of the present invention to provide a method for easily manufacturing a TFT which has a high on/off ratio and whose light-induced leakage current is small.

An embodiment of the present invention is a TFT in which at least a channel formation region includes a crystalline semiconductor, the crystalline semiconductor is shielded from light by being entirely overlapped with a gate electrode, and a sidewall insulating layer is provided on at least a side surface of the crystalline semiconductor.

An embodiment of the present invention is a TFT including a first wiring layer; an insulating layer provided so as to cover the first wiring layer; a first semiconductor layer which is positioned over the first wiring layer with the insulating layer interposed therebetween and is entirely overlapped with the first wiring layer; a second semiconductor layer provided over and in contact with the first semiconductor layer and having a lower carrier mobility than the first semiconductor layer; an impurity semiconductor layer provided in contact with the second semiconductor layer; a sidewall insulating layer provided so as to cover at least a sidewall of the first semiconductor layer; and a second wiring layer provided in contact with at least the impurity semiconductor layer.

An embodiment of the present invention is a TFT including a first wiring layer; an insulating layer provided so as to cover the first wiring layer; a first semiconductor layer which is positioned over the first wiring layer with the insulating layer interposed therebetween and is entirely overlapped with the first wiring layer; second semiconductor layers provided apart from each other over and in contact with the first semiconductor layer and having a lower carrier mobility than the first semiconductor layer; impurity semiconductor layers provided in contact with the second semiconductor layers; a sidewall insulating layer provided so as to cover at least a sidewall of the first semiconductor layer; and second wiring layers provided in contact with at least the impurity semiconductor layers.

An embodiment of the present invention is a manufacturing method of a TFT including the steps of forming a first wiring layer; forming an insulating layer so as to cover the first wiring layer; forming a semiconductor island in which a first semiconductor layer overlapping with the first wiring layer, a second semiconductor layer having a lower carrier mobility than the first semiconductor layer, and an impurity semiconductor layer are stacked; forming an insulating film so as to cover the semiconductor island; anisotropically etching the insulating film to expose the impurity semiconductor layer, so that a sidewall insulating layer covering at least a sidewall of the first semiconductor layer is formed; forming a second wiring layer over the impurity semiconductor layer and the sidewall insulating layer; and etching part of the second semiconductor layer and part of the impurity semiconductor layer, so that a source region and a drain region are formed.

An embodiment of the present invention is a manufacturing method of a TFT including the steps of forming a first wiring layer; forming an insulating layer so as to cover the first wiring layer; forming a semiconductor island in which a first semiconductor layer overlapping with the first wiring layer, a second semiconductor layer having a lower carrier mobility than the first semiconductor layer, and an impurity semiconductor layer are stacked; forming a first insulating film and a second insulating film so as to cover the semiconductor island; anisotropically etching the second insulating film to expose the first insulating film, so that a first sidewall insulating layer is formed; etching a portion of the first insulating film, which does not overlap with the first sidewall insulating layer, to expose the impurity semiconductor layer, so that a second sidewall insulating layer which, together with the first sidewall insulating layer, covers at least a sidewall of the first semiconductor layer is formed; forming a second wiring layer over the impurity semiconductor layer and the second sidewall insulating layer; and etching part of the second semiconductor layer and part of the impurity semiconductor layer, so that a source region and a drain region are formed.

Note that in this specification, a "film" refers to a film which is formed over the entire surface of an object by a CVD method (including a plasma CVD method and the like), a sputtering method, or the like. On the other hand, a "layer" refers to a layer which is formed by processing a film or a layer which is formed over an entire surface of an object and does not need further processing.

A TFT of an embodiment of the present invention can have small light-induced leakage current and a high on/off ratio.

Using a method for manufacturing a TFT of an embodiment of the present invention, a TFT having small light-induced leakage current and a high on/off ratio can be manufactured easily.

BRIEF DESCRIPTION OF THE DRAWINGS

In the accompanying drawings:

FIG. 1 illustrates a TFT of Embodiment 1;

FIGS. 17A to 17D illustrate electronic devices.

DETAILED DESCRIPTION OF THE INVENTION

Figure 2A:
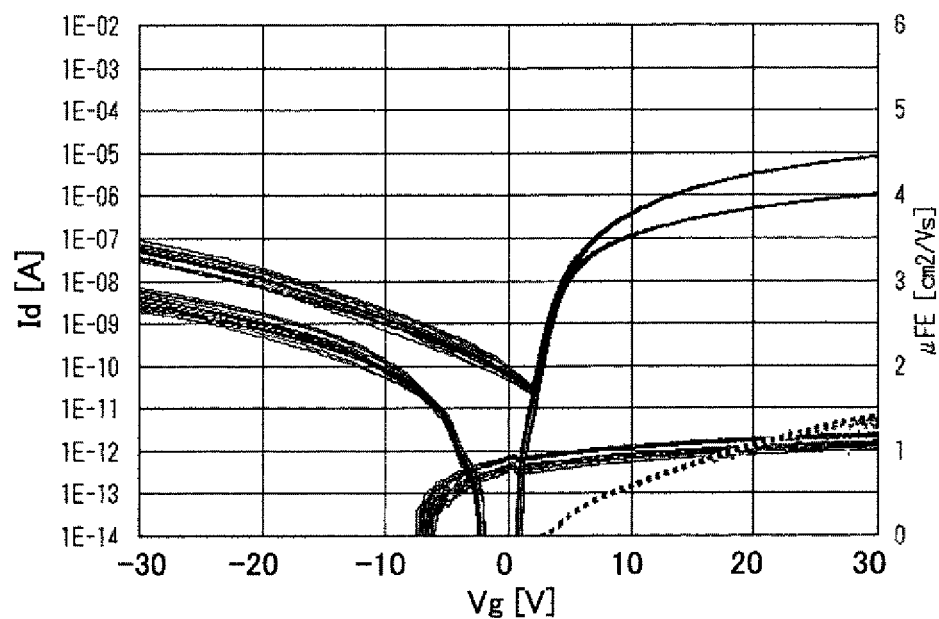
FIGS. 2A and 2B show a difference between I-V curves depending on whether a first wiring layer and a semiconductor layer overlap with each other.

Hereinafter, embodiments of the present invention will be described in detail with reference to the drawings. Note that the present invention is not limited to the following description and it will be easily understood by those skilled in the art that modes and details can be modified in various ways without departing from the spirit and the scope of the present invention. Therefore, the present invention should not be construed as being limited to the description in the embodiments below. Note that in description of structures of the invention with reference to the drawings, the same reference numerals are commonly used to denote the same components among different drawings. The same hatching pattern is applied to similar parts, and the similar parts are not especially denoted by reference numerals in some cases. In addition, for convenience, an insulating layer is, in some cases, not illustrated in plan views. However, a sidewall insulating layer is illustrated in the plan views without omission.

Embodiment 1

In this embodiment, an example of the structure of a TFT which is an embodiment of the present invention will be described.

FIG. 1 illustrates a plan view and a cross-sectional view (along X-Y of the plan view) of a TFT of this embodiment. The TFT illustrated in FIG. 1 is provided over a substrate 100 and includes a first wiring layer 102, an insulating layer 104 provided so as to cover the first wiring layer 102, a first semiconductor layer 106 entirely overlapped with the first wiring layer 102, a second semiconductor layer 108 provided over and in contact with the first semiconductor layer 106 and having a lower carrier mobility than the first semiconductor layer 106, an impurity semiconductor layer 110 provided in contact with the second semiconductor layer 108, an upper sidewall insulating layer 112 provided so as to cover at least a sidewall of the first semiconductor layer 106, and a second wiring layer 114 provided in contact with at least the impurity semiconductor layer 110. In addition, a lower sidewall insulating layer 113 is provided over a step of the insulating layer 104, which is formed due to the first wiring layer 102.

Since the upper sidewall insulating layer 112 and the lower sidewall insulating layer 113 enable an increase in coverage with a layer that is provided over the upper sidewall insulating layer 112 and the lower sidewall insulating layer 113, the first semiconductor layer 106 and the second semiconductor layer 108 need not be processed into a tapered shape. Accordingly, the first semiconductor layer 106 and the second semiconductor layer 108 may have a taper angle more than or equal to 60° and less than or equal to 90° at the side surfaces.

The substrate 100 is an insulating substrate. A glass substrate or a quartz substrate can be used as the substrate 100, for example. In this embodiment, a glass substrate is used. In the case where the substrate 100 is a mother glass, the substrate may have any size of from the first generation (e.g., 320 mm×400 mm) to the tenth generation (e.g., 2950 mm×3400 mm). However, the substrate is not limited thereto.

The first wiring layer 102 may be formed using a conductive material (e.g., a metal, a semiconductor to which an impurity element imparting one conductivity type is added, or the like). The first wiring layer 102 may have a single-layer structure or a stacked structure of plural layers. Here, a three-layer structure in which an aluminum layer is sandwiched between titanium layers is employed, for example. Note that the first wiring layer 102 forms at least a scan line and a gate electrode.

The insulating layer 104 may be formed using an insulating material (e.g., silicon nitride, silicon nitride oxide, silicon oxynitride, silicon oxide, or the like). The insulating layer 104 may have a single-layer structure or a stacked structure of plural layers. Here, a two-layer structure in which a silicon oxynitride layer is stacked over a silicon nitride layer is employed, for example. Note that the insulating layer 104 forms at least a gate insulating layer.

Note that "silicon oxynitride" contains more oxygen than nitrogen, and in the case where measurements are conducted using Rutherford backscattering spectrometry (RBS) and hydrogen forward scattering (HFS), silicon oxynitride preferably contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively.

Further, "silicon nitride oxide" contains more nitrogen than oxygen, and in the case where measurements are conducted using RBS and HFS, silicon nitride oxide preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

The first semiconductor layer 106 may be formed using a semiconductor material having a high carrier mobility. As the semiconductor material having a high carrier mobility, a crystalline semiconductor can be given as an example. As the crystalline semiconductor, a microcrystalline semiconductor can be given as an example. Here, a microcrystalline semiconductor is a semiconductor having an intermediate structure between an amorphous structure and a crystalline structure (including a single crystal structure and a polycrystalline structure). A microcrystalline semiconductor is a semiconductor having a third state that is stable in terms of free energy and is a crystalline semiconductor having short-range order and lattice distortion, in which columnar or needle-like crystals having a grain size of 2 nm to 200 nm inclusive, preferably 10 nm to 80 nm inclusive, further preferably 20 nm to 50 nm inclusive have grown in a direction normal to the substrate surface. Therefore, a crystal grain boundary is formed at the interface of the columnar or needle-like crystals in some cases.

Microcrystalline silicon, which is one of microcrystalline semiconductors, has a peak of Raman spectrum which is shifted to a lower wave number side than 520 cm$^{-1}$ that represents single crystal silicon. In other words, the peak of the Raman spectrum of the microcrystalline silicon is between 520 cm$^{-1}$ which represents single crystal silicon and 480 cm$^{-1}$ which represents amorphous silicon. In addition, microcrystalline silicon contains hydrogen or halogen at least 1 at. % or more in order to terminate a dangling bond. Moreover, when microcrystalline silicon contains a rare gas element such as He, Ar, Kr, or Ne to further promote lattice distortion, stability is increased and a favorable microcrystalline semiconductor can be obtained.

Moreover, when the concentration of oxygen and nitrogen included in the first semiconductor layer 106 (which is measured by secondary ion mass spectrometry) is less than $1 \times 10^{18}$ cm$^{-3}$, the crystallinity of the first semiconductor layer 106 can be increased.

The second semiconductor layer 108 functions as a buffer layer and therefore may be formed using a semiconductor material having a lower carrier mobility. The second semiconductor layer 108 preferably includes an amorphous semiconductor and a minute semiconductor crystal grain and has lower energy at an Urbach edge measured by a constant photocurrent method (CPM) or photoluminescence spectroscopy and a smaller amount of absorption spectra of defects, as compared to a conventional amorphous semiconductor. That is, as compared to the conventional amorphous semiconductor, such a semiconductor layer is a well-ordered semiconductor layer which has fewer defects and whose tail slope of a level at a band edge (a mobility edge) in the valence band is steep. Such a semiconductor layer is referred to as a "layer containing an amorphous semiconductor" in this specification.

The second semiconductor layer 108 may be formed using a "layer containing an amorphous semiconductor", a "layer containing an amorphous semiconductor" which contains halogen, or a "layer containing an amorphous semiconductor" which contains nitrogen, and is preferably formed using a "layer containing an amorphous semiconductor" which contains an NH group or an NH$_2$ group. Note that the present invention is not limited to this.

An interface region between the first semiconductor layer 106 and the second semiconductor layer 108 includes microcrystalline semiconductor regions and an amorphous semiconductor between the microcrystalline semiconductor regions. Specifically, the interface region between the first semiconductor layer 106 and the second semiconductor layer 108 includes a conical or pyramidal microcrystalline semiconductor region which extends from the first semiconductor layer 106 and a "layer containing an amorphous semiconductor" which is similar to the second semiconductor layer 108.

When the second semiconductor layer 108 is formed using a "layer containing an amorphous semiconductor", a "layer containing an amorphous semiconductor" which contains halogen, a "layer containing an amorphous semiconductor" which contains nitrogen, or a "layer containing an amorphous semiconductor" which contains an NH group or an NH$_2$ group, for example, off-state current of the TFT can be reduced. Further, since the interface region has a conical or pyramidal microcrystalline semiconductor region, resistance in the vertical direction (the film thickness direction), that is, resistance between the second semiconductor layer 108 and a source region or a drain region formed using the impurity semiconductor layer 110, can be reduced, so that on-state current of the TFT can be increased.

When the first semiconductor layer 106 is thin, on-state current is small, whereas when the first semiconductor layer 106 is thick, the contact area between the first semiconductor layer 106 and the second wiring layer 114 is increased and thereby off-state current is increased.

It is preferable that most of the microcrystalline semiconductor region is formed of a conical or pyramidal crystal grain whose width becomes narrower from the insulating layer 104 toward the second semiconductor layer 108. Alternatively, most of the microcrystalline semiconductor region may be formed of a crystal grain whose width becomes wider from the insulating layer 104 toward the second semiconductor layer 108.

When the microcrystalline semiconductor region includes a conical or pyramidal crystal grain whose width becomes narrower from the insulating layer 104 toward the second semiconductor layer 108 in the above interface region, the proportion of the microcrystalline semiconductor region on the first semiconductor layer 106 side is higher than that on the second semiconductor layer 108 side. The microcrystalline semiconductor region grows from a surface of the first semiconductor layer 106 in the film thickness direction. When the flow rate of hydrogen with respect to that of silane in a source gas is low (that is, the dilution ratio is low) or the concentration of a source gas containing nitrogen is high, crystal growth of the microcrystalline semiconductor region is reduced, and thus, a crystal grain comes to have a conical or pyramidal shape, and a large part of the deposited semiconductor becomes amorphous.

Further, the interface region preferably includes nitrogen, in particular, an NH group or an $NH_2$ group. This is because defects are reduced and carriers flow easily when nitrogen, in particular, an NH group or an $NH_2$ group is bonded with dangling bonds of silicon atoms at an interface of a crystal included in the microcrystalline semiconductor region or at an interface between the microcrystalline semiconductor region and the amorphous semiconductor region. Accordingly, by setting the concentration of nitrogen, preferably, an NH group or an $NH_2$ group at $1\times10^{20}$ cm$^{-3}$ to $1\times10^{21}$ cm$^{-3}$, the dangling bonds of silicon atoms can be easily cross-linked with nitrogen, preferably an NH group or an $NH_2$ group, so that carriers can flow easily. As a result, a bond which promotes the carrier transfer is formed at a crystal grain boundary or a defect, whereby the carrier mobility of the interface region is increased. Thus, the field-effect mobility of the TFT is increased.

Further, when the concentration of oxygen in the interface region is reduced, defects at the interface between the microcrystalline semiconductor region and the amorphous semiconductor region or the interface between crystal grains can be reduced, so that bonds which inhibit carrier transfer can be reduced.

When the distance from the interface of the insulating layer 104 to the tip of the conical or pyramidal crystal grain of the second semiconductor layer 108 is set at greater than or equal to 3 nm and less than or equal to 80 nm, preferably greater than or equal to 5 nm and less than or equal to 30 nm, off-state current of the TFT can be effectively reduced.

The impurity semiconductor layer 110 is formed using a semiconductor to which an impurity element imparting one conductivity type is added. In the case where the TFT is n-type, phosphorus (P) or arsenic (As) can be used as the impurity element imparting one conductivity type, for example. In the case where the TFT is p-type, boron (B) can be added as an impurity element imparting one conductivity type, for example. However, the TFT is preferably n-type. Therefore, silicon to which phosphorus (P) is added is used as an example here. The impurity semiconductor layer 110 may be formed using an amorphous semiconductor or a crystalline semiconductor such as a microcrystalline semiconductor.

In the case where the impurity semiconductor layer 110 is formed using an amorphous semiconductor, the flow rate of a dilution gas is 1 time to 10 times, preferably 1 time to 5 times the flow rate of a deposition gas. In the case where the impurity semiconductor layer 110 is formed using a crystalline semiconductor, the flow rate of the dilution gas is 10 times to 2000 times, preferably 50 times to 200 times the flow rate of the deposition gas.

The upper sidewall insulating layer 112 may be formed using an insulating material (e.g., silicon nitride, silicon nitride oxide, silicon oxynitride, silicon oxide, or the like) in a manner similar to that of the insulating layer 104. Alternatively, the upper sidewall insulating layer 112 may be formed using amorphous silicon. Here, a silicon oxynitride layer is formed, for example.

The lower sidewall insulating layer 113 may be formed using the same material as the upper sidewall insulating layer 112 and can be formed in the same step as that of the upper sidewall insulating layer 112. The lower sidewall insulating layer 113 reduces the step over the insulating layer 104, which is formed due to the first wiring layer 102, so that favorable coverage with the second wiring layer 114 can be obtained.

Further, enough distance can be kept between the first wiring layer 102 and the second wiring layer 114, whereby parasitic capacitance can be reduced.

The second wiring layer 114 may be formed using a conductive material (e.g., a metal, a semiconductor to which an impurity element imparting one conductivity type is added, or the like) in a manner similar to that of the first wiring layer 102. The second wiring layer 114 may have a single-layer structure or a stacked structure of plural layers. Here, a three-layer structure in which an aluminum layer is sandwiched between titanium layers is employed, for example. Note that the second wiring layer 114 forms at least a signal line, a source electrode, and a drain electrode.

Here, the structure of the TFT illustrated in FIG. 1 is described.

In the TFT illustrated in FIG. 1, a semiconductor layer having a high carrier mobility is provided as the first semiconductor layer 106, and a semiconductor layer having a low carrier mobility is provided as the second semiconductor layer 108, which enables an increase in on-state current and a reduction in off-state current. The main path of the on-state current is the first semiconductor layer 106, and the main path of the off-state current is the second semiconductor layer 108.

In addition, the TFT illustrated in FIG. 1 is provided with the upper sidewall insulating layer 112 which covers at least the sidewall of the first semiconductor layer 106, so that off-state current can be made further small.

In order to prevent an increase in off-state current (an increase in photocurrent) in a situation where the TFT is irradiated with light, a portion on the substrate 100 side of the first semiconductor layer 106 needs to be shielded from light. If a step of providing a layer for shielding is added, productivity is lowered. Therefore, it is preferable that the first wiring layer 102 functioning as a gate electrode is configured to shield the first semiconductor layer 106 from light.

Here, since the first semiconductor layer 106 is entirely overlapped with the first wiring layer 102 in the TFT illustrated in FIG. 1, an influence of photocurrent which is caused by light from the substrate 100 side can be reduced.

Figure 2B:
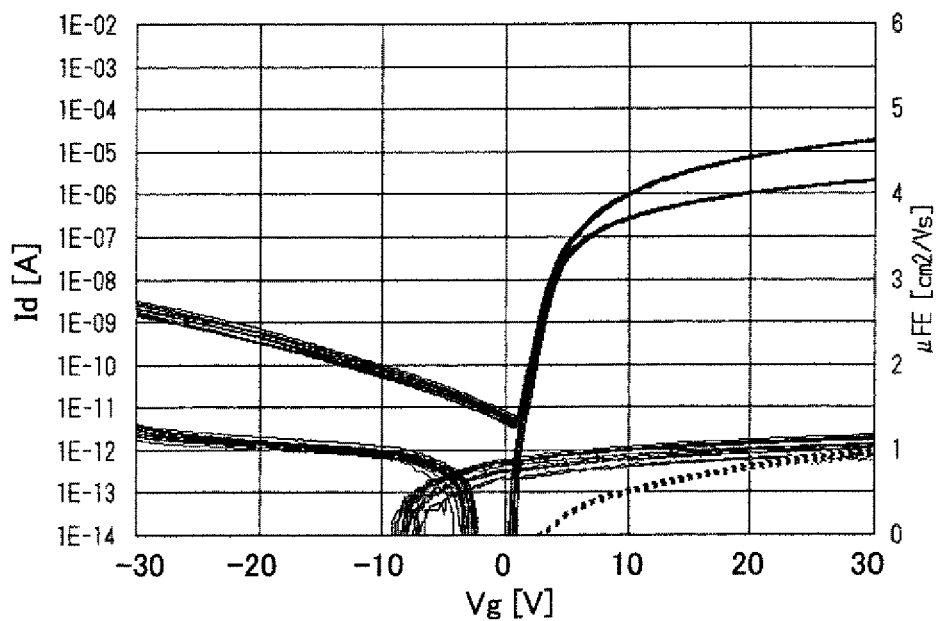

FIG. 2A shows a change of drain current $I_d$ against gate voltage $V_g$ in the TFT of FIG. 1 (having the structure of FIG. 1 but not provided with the sidewall insulating layers). FIG. 2B shows a change of drain current $I_d$ against gate voltage $V_g$ in a TFT in which a gate electrode formed of the first wiring layer 102 is narrow and at least part of an end portion of the first semiconductor layer 106 does not overlap with the first wiring layer 102 and is positioned on an outer side than the edge of the first wiring layer 102. Note that FIG. 2A and FIG. 2B show results of measurement which is performed without irradiation with light from the substrate 100 side.

In this specification, "gate voltage" refers to a potential difference between the potential of the source and the potential of the gate.

In comparing FIG. 2A with FIG. 2B, when the gate voltage $V_g$ is shifted in a minus direction in FIG. 2A, off-state current is increased, whereas even when the gate voltage $V_g$ is shifted in a minus direction in FIG. 2B, an increase in off-state current is reduced. Accordingly, it can be found that off-state current of the TFT having the result of FIG. 2A (the TFT having the structure of FIG. 1 but not provided with the insulating layers) is increased and sufficient switching characteristics are difficult to be obtained.

Figure 3A:
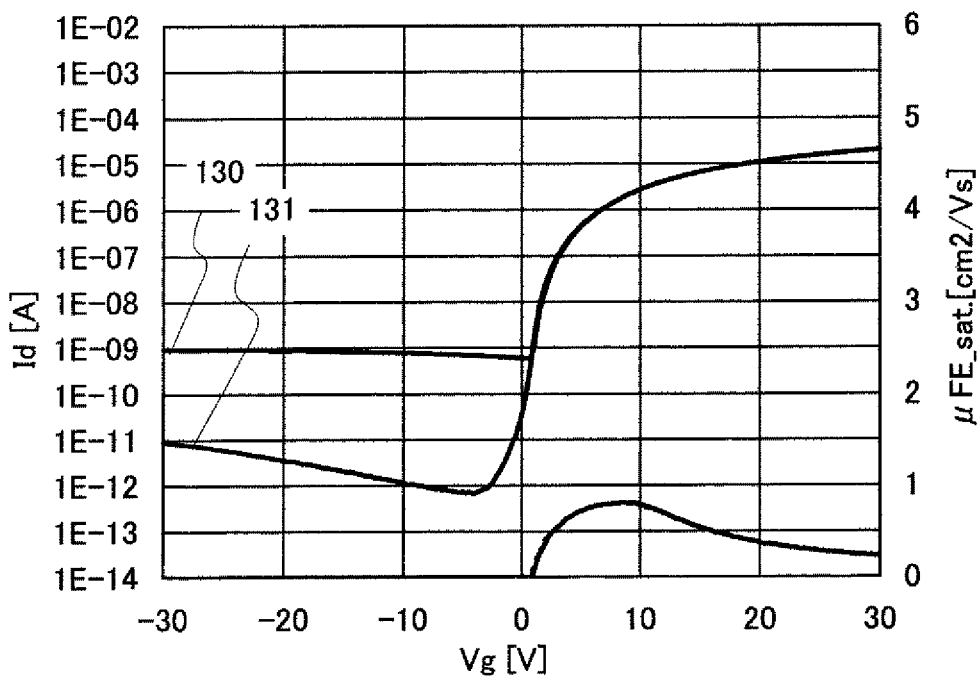
FIGS. 3A and 3B show a difference between I-V curves depending on the presence of a first semiconductor layer.
Figure 3B:
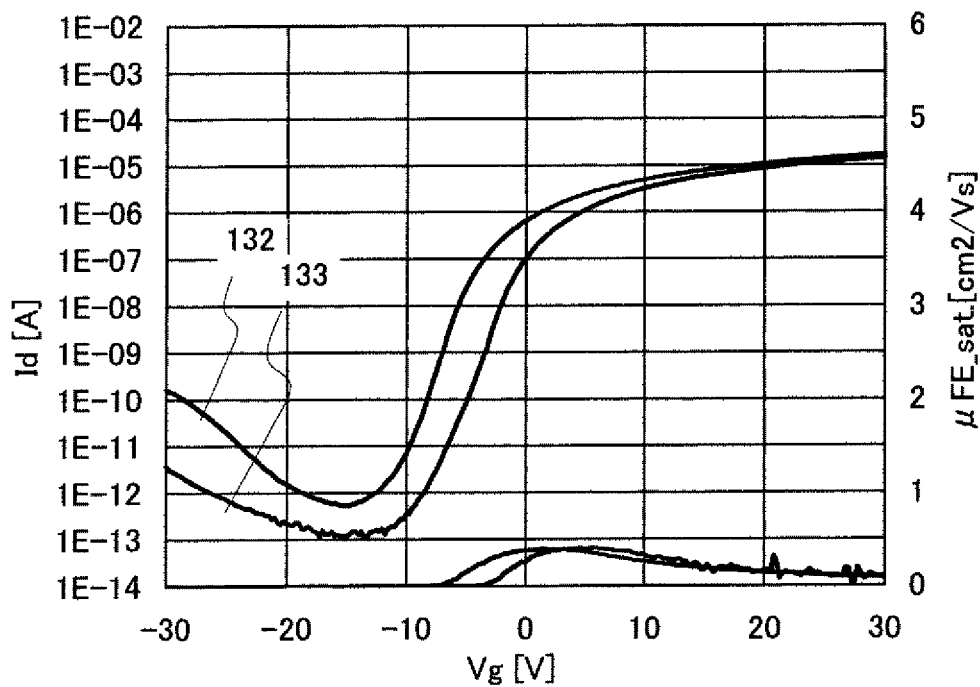

FIG. 3A shows a change of drain current $I_d$ against gate voltage $V_g$ in the TFT having the result of FIG. 2B. In FIG. 3A, a curve 130 shows a result measured under irradiation with light, and a curve 131 shows a result measured without irradiation with light. The TFT having the result of FIG. 3B is not provided with the first semiconductor layer 106 and includes the second semiconductor layer 108 which is an amorphous semiconductor layer; except these points, the TFT of FIG. 3B is almost similar to the TFT having the result of FIG. 3A. In FIG. 3B, a curve 132 shows a result measured under irradiation with light, and a curve 133 shows a result measured without irradiation with light. Note that the drain voltage at the measurement is 10 V.

In this specification, "drain voltage" refers to a potential difference between the potential of the source and the potential of the drain.

The amorphous semiconductor layer can be formed by increasing the flow rate of a deposition gas. For example, the flow rate of a dilution gas is 1 time to 10 times, preferably 1 time to 5 times the flow rate of the deposition gas.

In comparing FIG. 3A with FIG. 3B, it can be found that in the case where the semiconductor layer is formed of only the amorphous semiconductor layer, an increase in off-state current under irradiation with light is reduced even with the structure in which an end portion of the semiconductor layer is positioned on an outer side than the edge of the gate electrode.

Thus, it is found that an increase in off-state current under irradiation with light does not become a problem in the TFT whose semiconductor layer is an amorphous semiconductor layer and is a specific problem in the TFT whose semiconductor layer has crystallinity.

Figure 4A:
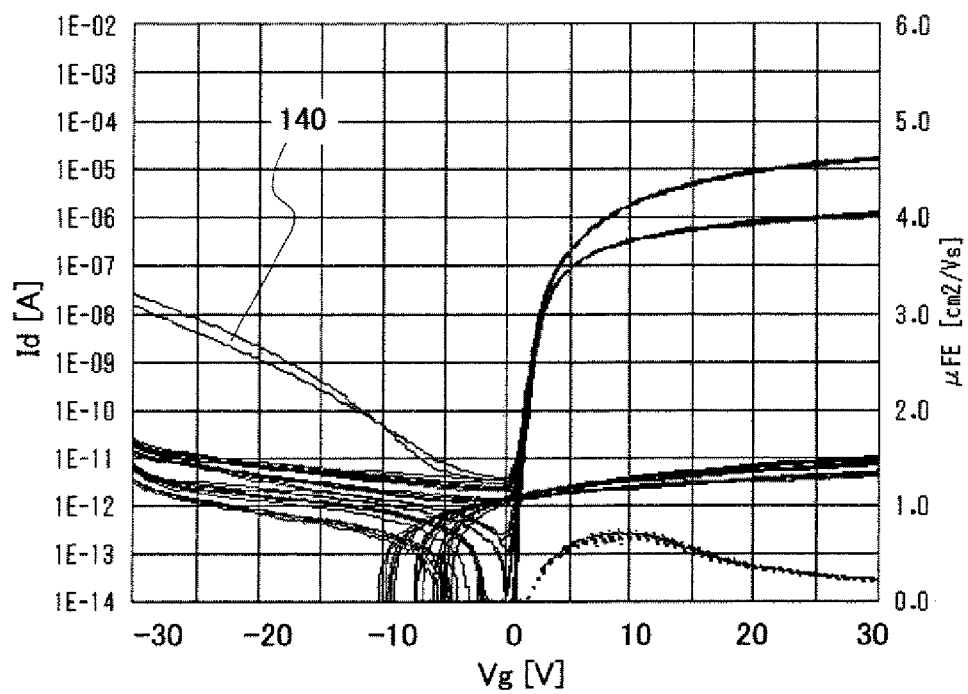
FIGS. 4A and 4B show a difference between I-V curves depending on the presence of sidewall insulating layers.

FIG. 4A shows a change of drain current $I_d$ against gate voltage $V_g$ in the TFT of FIG. 1. The TFT having the result of FIG. 4B is not provided with the upper sidewall insulating layer 112 and the lower sidewall insulating layer 113; except this point, the TFT of FIG. 4B is the same as the TFT of FIG. 1.

FIG. 4A shows a change of drain current $I_d$ against gate voltage $V_g$ in the case where the distance from a surface of the upper sidewall insulating layer 112 to a surface of the first semiconductor layer 106 (hereinafter such a distance is referred to as a "thickness of a sidewall insulating layer" for convenience) is 30 nm to 40 nm. Here, the distance from the surface of the upper sidewall insulating layer 112 to the surface of the first semiconductor layer 106 refers to the length of the shortest line segment among line segments connecting an arbitrary point on the surface of the upper sidewall insulating layer 112 to an arbitrary point on the surface of the first semiconductor layer 106. Further, FIG. 5 shows a scanning transmission electron microscope (STEM) image in the vicinity of the upper sidewall insulating layer 112 in this case.

Figure 4B:
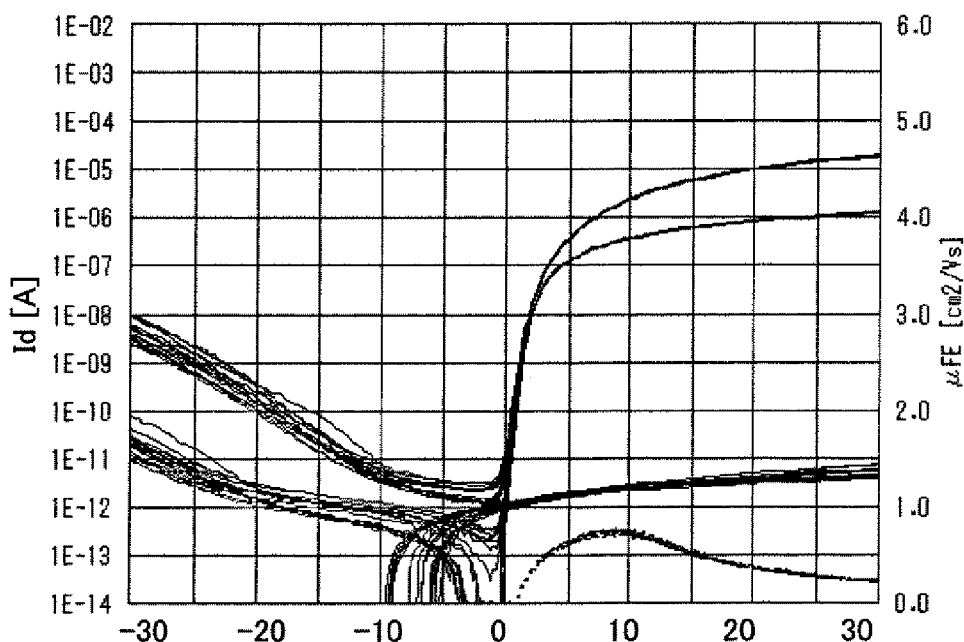

In comparing FIG. 4A with FIG. 4B, even when the gate voltage $V_g$ is shifted in a minus direction, an increase in off-state current is reduced in FIG. 4A. Further, a difference cannot be seen in on-state current between FIG. 4A and FIG. 4B.

Accordingly, provision of the upper sidewall insulating layer 112 as in FIG. 1 can reduce off-state current.

Figure 5:
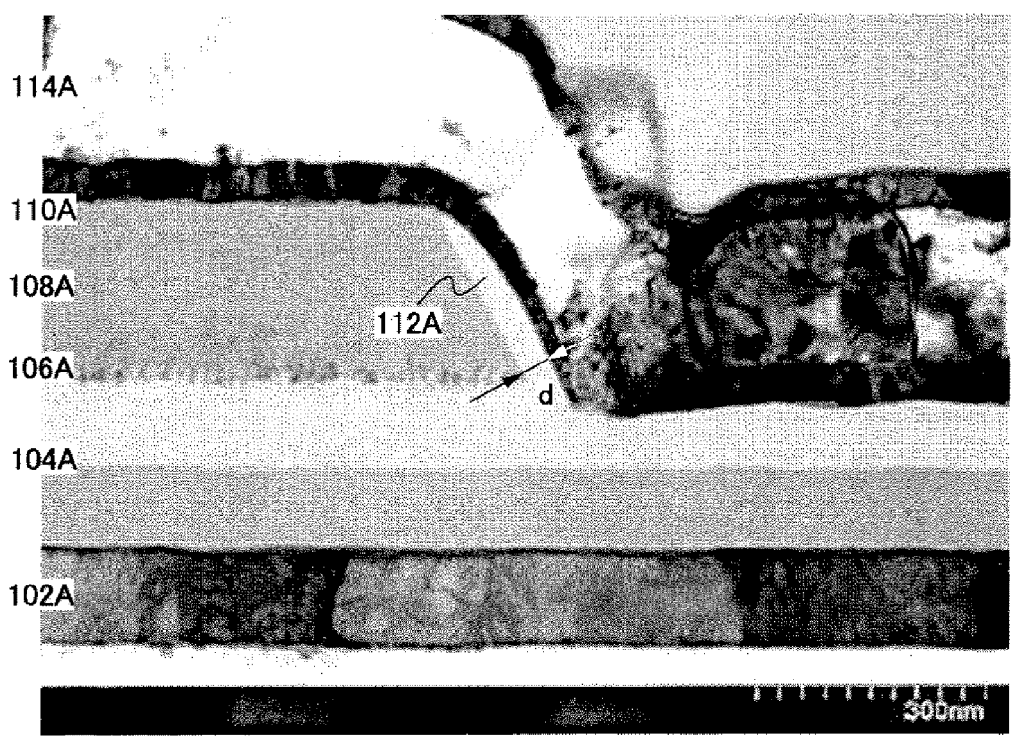
FIG. 5 shows a STEM image of a TFT whose I-V curve is shown in FIG. 4A.

In the STEM image shown in FIG. 5, a first wiring layer 102A, an insulating layer 104A, a first semiconductor layer 106A, a second semiconductor layer 108A, an impurity semiconductor layer 110A, an upper sidewall insulating layer 112A, and a second wiring layer 114A are shown. The thickness d of the upper sidewall insulating layer 112A can be estimated to be 35 nm approximately.

From FIG. 4A, it is preferable that the thickness of the upper sidewall insulating layer 112 be at least in the above-mentioned range.

An irregular curve 140 is observed in FIG. 4A. A reason of this is supposedly that the upper sidewall insulating layer 112 is formed of one insulating layer and this might hinder a reduction of the variation in thickness over the substrate plane. This problem can be solved by employing a TFT described in Embodiment 3.

As described above, the TFT of this embodiment is a TFT with small light-induced leakage current and a high on/off ratio.

Embodiment 2

In this embodiment, an example of a manufacturing method of a TFT, which is an embodiment of the present invention, will be described. Specifically, a manufacturing method of the TFT described in Embodiment 1 will be described. Note that portions that are the same as those of Embodiment 1 are generally denoted by the same reference numerals.

Figure 6A:
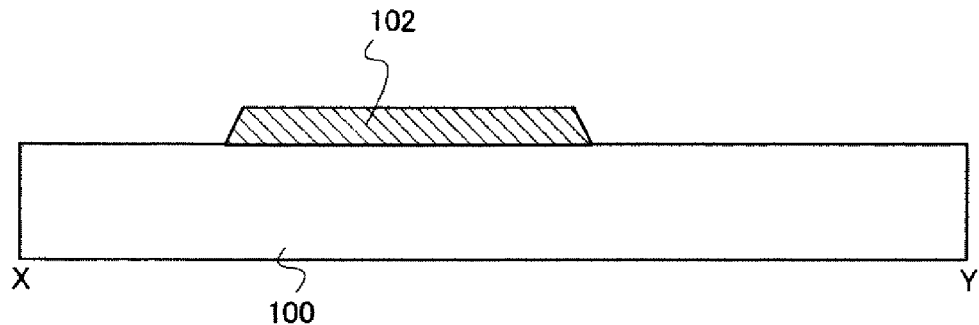
FIGS. 6A to 6C illustrate a manufacturing method of the TFT illustrated in FIG. 1.

First, a first wiring layer 102 is formed over a substrate 100 (FIG. 6A). The first wiring layer 102 may be formed in such a manner that a conductive material film is formed over an entire surface of the substrate 100 by a CVD method or a sputtering method and is processed by a photolithography method.

Figure 6B:
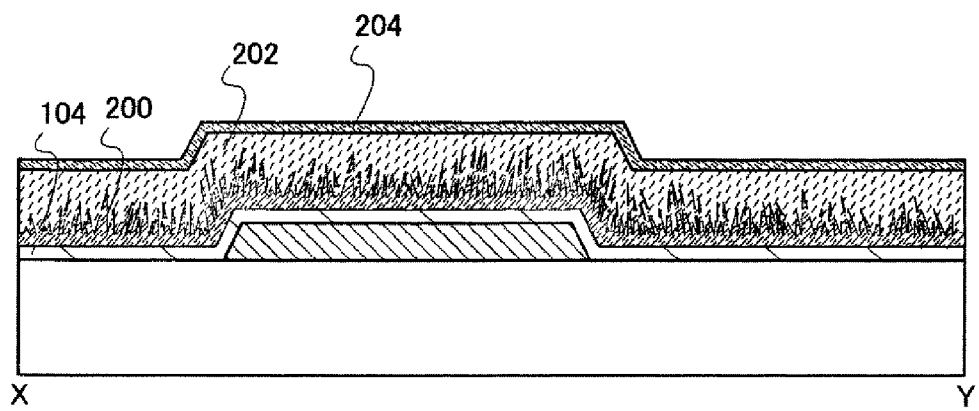

Next, an insulating layer 104 is formed so as to cover the first wiring layer 102. A first semiconductor film 200, a second semiconductor film 202, and an impurity semiconductor film 204 are formed over the insulating layer 104 (FIG. 6B).

The first semiconductor film 200 is formed using glow discharge plasma in a reaction chamber of a plasma CVD apparatus with the use of a mixture of hydrogen and a deposition gas containing silicon (such as $SiH_4$). Alternatively, the first semiconductor film 200 is formed using glow discharge plasma with the use of a mixture of hydrogen, a rare gas such as helium (He), neon (Ne), or krypton (Kr), and a deposition gas containing silicon. In the formation of the first semiconductor film 200, the flow rate of hydrogen is 10 times to 2000 times, preferably 10 times to 200 times the flow rate of the deposition gas containing silicon.

Alternatively, the first semiconductor film 200 may be formed using a deposition gas such as $GeH_4$ or $Ge_2H_6$ so as to include germanium.

Before formation of the first semiconductor film 200, impurity elements in the reaction chamber of the plasma CVD apparatus may be removed by introducing a deposition gas containing silicon or germanium with the air in the reaction chamber exhausted, so that impurity elements at the interface of the deposited film can be reduced. Accordingly, electric characteristics of the TFT can be increased.

The second semiconductor film 202 is formed using glow discharge plasma in a reaction chamber of the plasma CVD apparatus with the use of a mixture of hydrogen and a deposition gas containing silicon. At this time, the ratio of the flow rate of hydrogen with respect to that of a deposition gas containing silicon is reduced (that is, a dilution ratio is reduced) compared to the formation condition of the first semiconductor film 200. Accordingly, the crystal growth is reduced and a semiconductor film is deposited to form the second semiconductor film 202 which does not contain a microcrystalline semiconductor region.

At the initial stage of deposition of the second semiconductor film 202, by reducing the ratio of the flow rate of hydrogen with respect to that of the deposition gas containing silicon (that is, by reducing the dilution ratio) compared to the formation condition of the first semiconductor film 200, a microcrystalline semiconductor region can remain in the second semiconductor film 202. Alternatively, in the case where the ratio of the flow rate of hydrogen with respect to that of the deposition gas containing silicon is further reduced (that is, the dilution ratio is further reduced) compared to the above condition, a semiconductor film which is a "layer containing an amorphous semiconductor" can be formed as the second semiconductor film 202. Furthermore, in the case where the ratio of the flow rate of hydrogen with respect to that of the deposition gas containing silicon is further reduced (that is, the dilution ratio is further reduced) compared to the above condition and a gas containing nitrogen is mixed, an amorphous semiconductor region in the second semiconductor film 202 can be formed large. Note that the second semiconductor film 202 may be formed using germanium.

In addition, at the initial stage of the deposition of the second semiconductor film 202, the first semiconductor film 200 serves as a seed crystal and the film is deposited on the entire surface. After that, the crystal growth is partly suppressed, and a conical or pyramidal microcrystalline semiconductor region grows (in the middle stage of the deposition). Further, the crystal growth of the conical or pyramidal microcrystalline semiconductor region is suppressed, and the second semiconductor film 202 which does not include a microcrystalline semiconductor region in an upper portion is formed (in the later stage of the deposition).

It is preferable that nitrogen be contained at $1 \times 10^{20}$ cm$^{-3}$ to $1 \times 10^{21}$ cm$^{-3}$ in the second semiconductor film 202. At this time, nitrogen preferably exists in a state of an NH group or an NH$_2$ group. This is because dangling bonds of a semiconductor atom are easily cross-linked with nitrogen, an NH group, or an NH$_2$ group, and carriers can flow without difficulty.

At the time of forming the second semiconductor film 202, the flow rate of a dilution gas is 10 times to 2000 times, preferably 50 times to 200 times that of the deposition gas. Preferably, the ratio of the flow rate of the dilution gas with respect to that of the deposition gas is lower than that in the case of forming the first semiconductor film 200.

The oxygen concentration in the second semiconductor film 202 is preferably low. By reducing the oxygen concentration in the second semiconductor film 202, bonds at the interface between the microcrystalline semiconductor region and the amorphous semiconductor region or at the interface between the microcrystalline semiconductor region in the first semiconductor film 200 and the microcrystalline semiconductor region in the second semiconductor film 202, which inhibits carrier transfer, can be reduced.

The impurity semiconductor film 204 may be formed using the formation gas of the first semiconductor film 200 or the second semiconductor film 202, to which an impurity element imparting one conductivity type is added. For example, a gas containing PH$_3$ may be added to the formation gas.

Figure 6C:
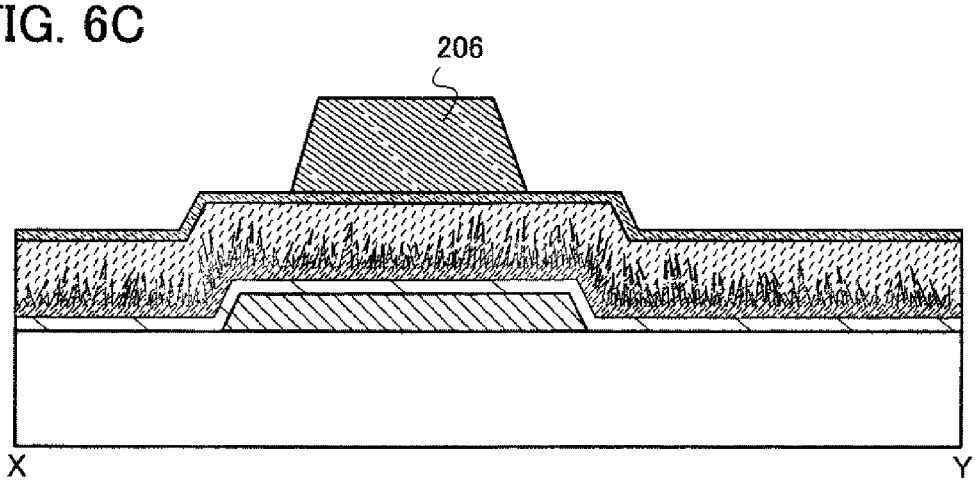

Next, a resist mask 206 is formed over the impurity semiconductor film 204 (FIG. 6C).

Figure 7A:
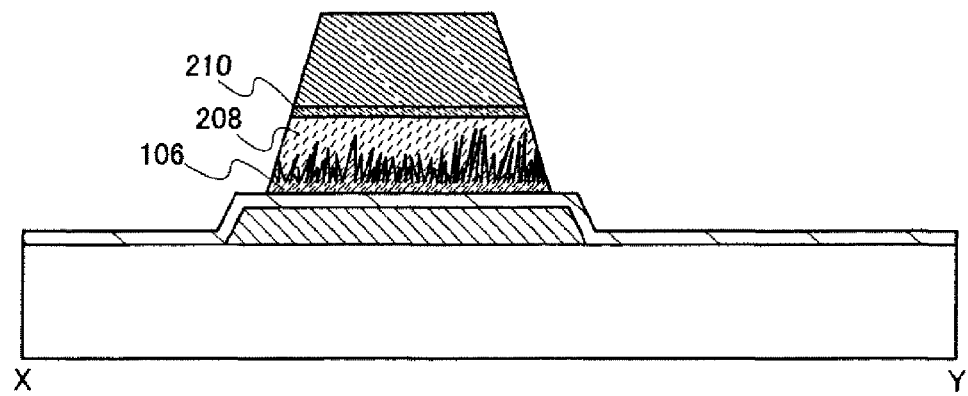
FIGS. 7A to 7C illustrate a manufacturing method of the TFT illustrated in FIG. 1.

Then, the first semiconductor film 200, the second semiconductor film 202, and the impurity semiconductor film 204 are processed using the resist mask 206, so that a first semiconductor layer 106, a second semiconductor layer 208, and an impurity semiconductor layer 210 are formed (FIG. 7A).

Figure 7B:
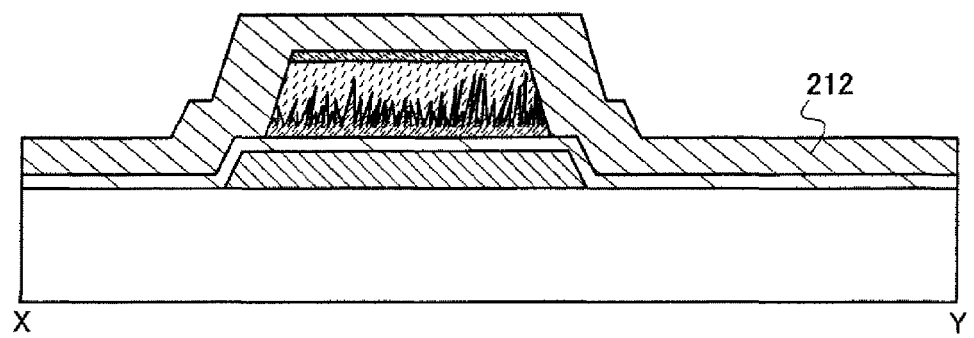

Next, a sidewall insulating film 212 is formed so as to cover the first semiconductor layer 106, the second semiconductor layer 208, and the impurity semiconductor layer 210 (FIG. 7B).

Figure 7C:
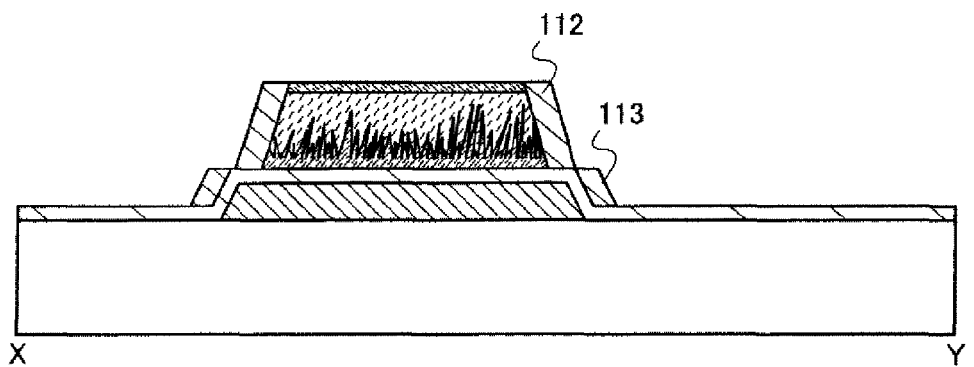

Then, the sidewall insulating film 212 is etched to form an upper sidewall insulating layer 112 and a lower sidewall insulating layer 113 (FIG. 7C). Here, a highly anisotropic etching method is employed. That is, etching is performed so that the thickness of the sidewall insulating film 212 is reduced uniformly in a direction perpendicular to a surface of the substrate 100. In this embodiment, etching is performed until the impurity semiconductor layer 210 is exposed. With such a highly anisotropic etching method, the upper sidewall insulating layer 112 which covers at least a sidewall of the first semiconductor layer 106 can be formed, and in addition the lower sidewall insulating layer 113 can be formed over a step of the insulating layer 104, which is formed due to the first wiring layer 102.

Figure 8A:
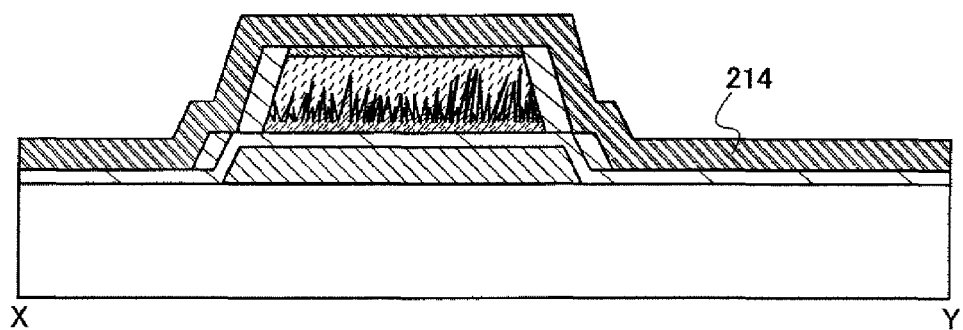
FIGS. 8A to 8C illustrate a manufacturing method of the TFT illustrated in FIG. 1.

Next, a conductive film 214 is formed so as to cover the impurity semiconductor layer 210, the upper sidewall insulating layer 112, and the lower sidewall insulating layer 113 (FIG. 8A). The conductive film 214 may be formed by a CVD method or a sputtering method.

Figure 8B:
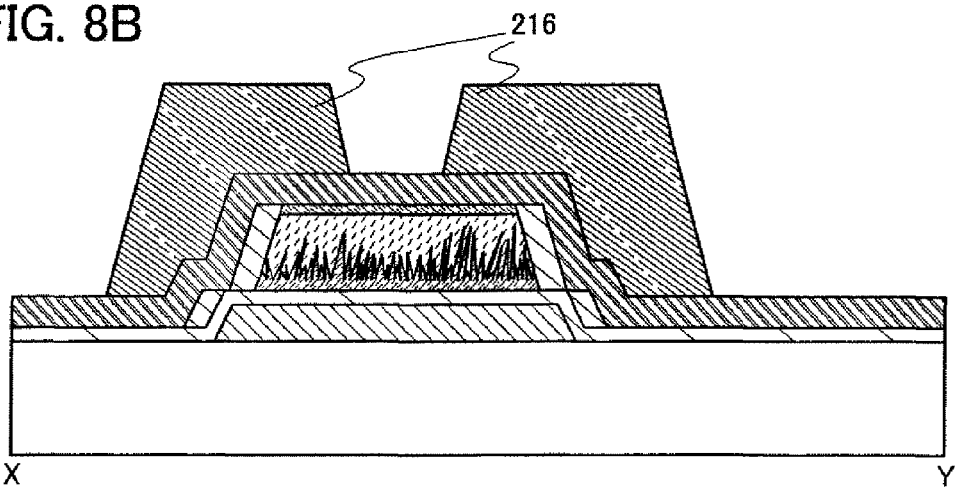

Next, a resist mask 216 is formed over the conductive film 214 (FIG. 8B).

Figure 8C:
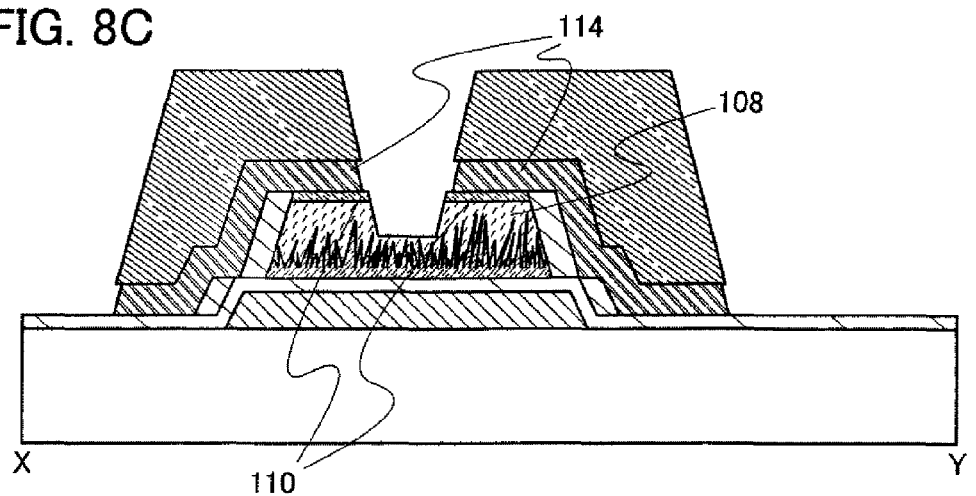

Then, the conductive film 214, the impurity semiconductor layer 210, and the second semiconductor layer 208 are processed using the resist mask 216, so that a second wiring layer 114, an impurity semiconductor layer 110, and a second semiconductor layer 108 are formed (FIG. 8C). In this processing, the first semiconductor layer 106 is not exposed and the second semiconductor layer 108 is exposed.

Through the above-described process, the TFT illustrated in FIG. 1 can be manufactured. Using the manufacturing method of a TFT of this embodiment, a TFT with small light-induced leakage current and a high on/off ratio can be manufactured easily.

Embodiment 3

In the modes of a TFT and a manufacturing method thereof described in Embodiments 1 and 2, the sidewall insulating layers have a single-layer structure; however, the present invention is not limited thereto. The sidewall insulating layer may be formed of a plurality of layers of different materials. In this embodiment, a mode in which the sidewall insulating layer has a two-layer structure will be described.

Figure 9A:
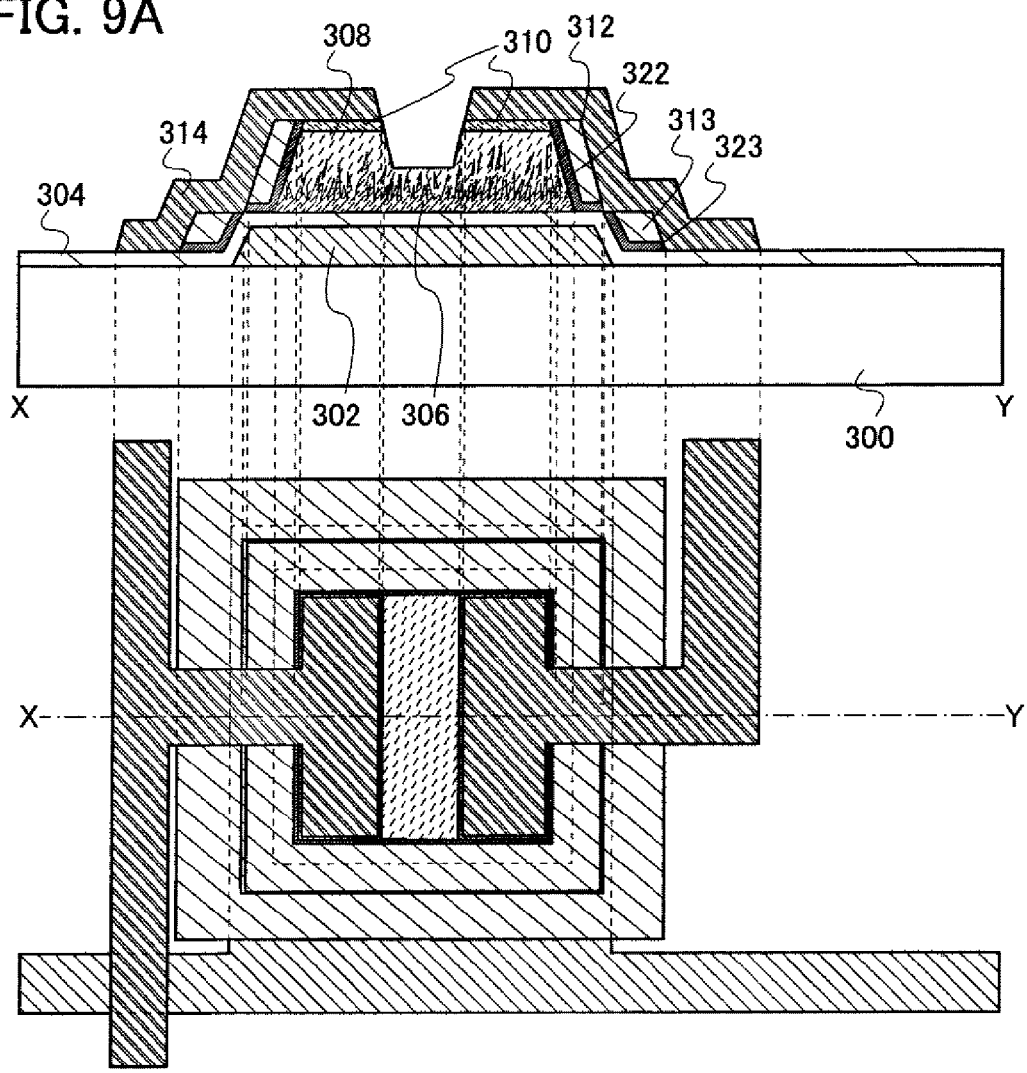
FIGS. 9A and 9B illustrate TFTs of Embodiment 3.

That is, the TFT of this embodiment illustrated in FIG. 9A is provided over a substrate 300 and includes a first wiring layer 302, an insulating layer 304 provided so as to cover the first wiring layer 302, a first semiconductor layer 306 entirely overlapped with the first wiring layer 302, a second semiconductor layer 308 provided over and in contact with the first semiconductor layer 306 and having a lower carrier mobility than the first semiconductor layer 306, an impurity semiconductor layer 310 provided in contact with the second semiconductor layer 308, a sidewall insulating layer having a stacked structure provided so as to cover at least a sidewall of the first semiconductor layer 306, and a second wiring layer 314 provided in contact with at least the impurity semiconductor layer 310. Here, the sidewall insulating layer having a stacked structure is formed by stacking an upper base sidewall insulating layer 322 and an upper sidewall insulating layer 312. The upper base sidewall insulating layer 322 and the upper sidewall insulating layer 312 are preferably formed using different materials. In addition, a lower base sidewall insulating layer 323 and a lower sidewall insulating layer 313 are stacked over a step of the insulating layer 304, which is formed due to the first wiring layer 302.

In the case of forming a sidewall insulating layer to have a stacked structure, etching at the time of formation can be easily controlled compared to the case of employing a single-layer insulating layer. For example, even in the case of using a mother glass of the tenth generation (e.g., 2950 mm×3400 mm) as the substrate 300, the total thickness of the sidewall insulating layer over the substrate plane can be made uniform.

The other structures are similar to those of Embodiment 1.

Figure 9B:
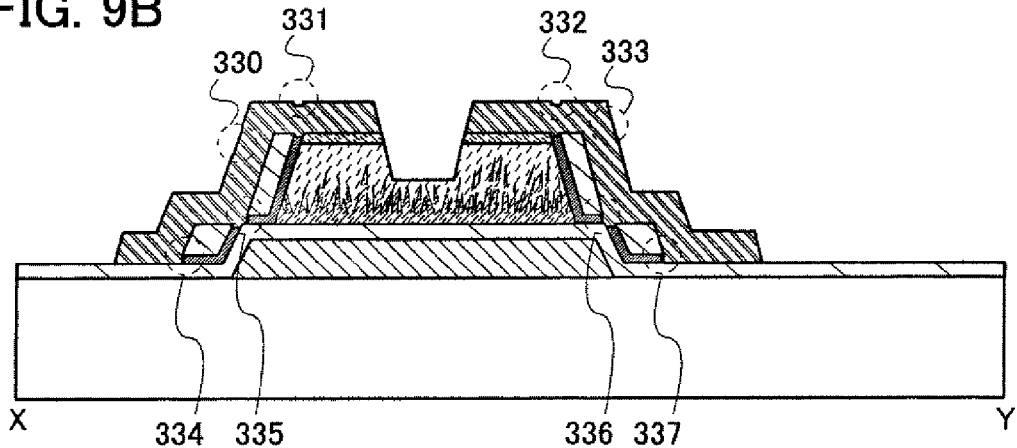

The TFT of this embodiment is not limited to the one illustrated in FIG. 9A, and a TFT as illustrated in FIG. 9B may be formed. That is, the upper base sidewall insulating layer 322 and the lower base sidewall insulating layer 323 may be over-etched, and a depression portion 330, a depression portion 331, a depression portion 332, and a depression portion 333 may be provided on a surface of the second wiring layer 314. At this time, a cavity 334, a cavity 335, a cavity 336, and a cavity 337 may be provided.

Embodiment 4

In this embodiment, an example of a manufacturing method of a TFT, which is an embodiment of the present invention, will be described. Specifically, a manufacturing method of the TFT described in Embodiment 3 will be described. Note that portions that are the same as those of Embodiment 3 are generally denoted by the same reference numerals.

The TFT described in Embodiment 3 includes a sidewall insulating layer having a two-layer structure. Here, a manufacturing method of a TFT including a sidewall insulating layer having a stacked structure in which a silicon oxynitride layer is stacked over a silicon nitride layer will be described.

First, a state similar to that illustrated in FIG. 7A of Embodiment 2 is formed. Then, the resist mask 206 is removed.

Figure 10A:
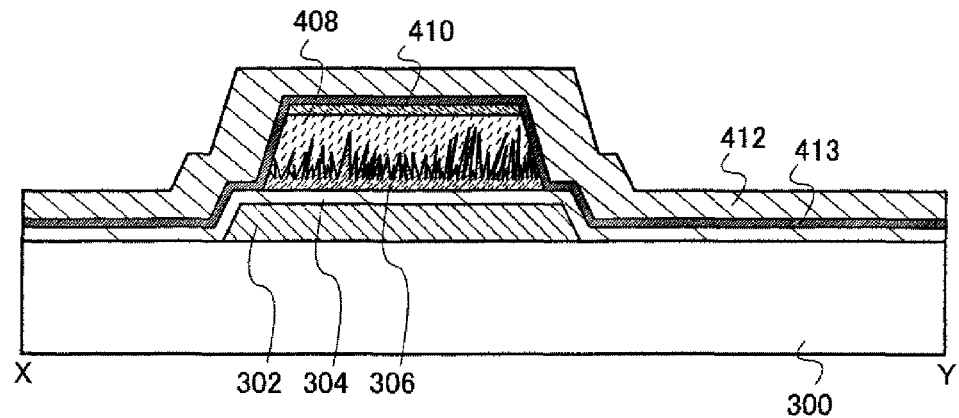
FIGS. 10A to 10C illustrate a manufacturing method of the TFT illustrated in FIGS. 9A and 9B.

Then, a silicon nitride film 413 and a silicon oxynitride film 412 are formed so as to cover a first semiconductor layer 306, a second semiconductor layer 408, and an impurity semiconductor layer 410 (FIG. 10A).

Figure 10B:
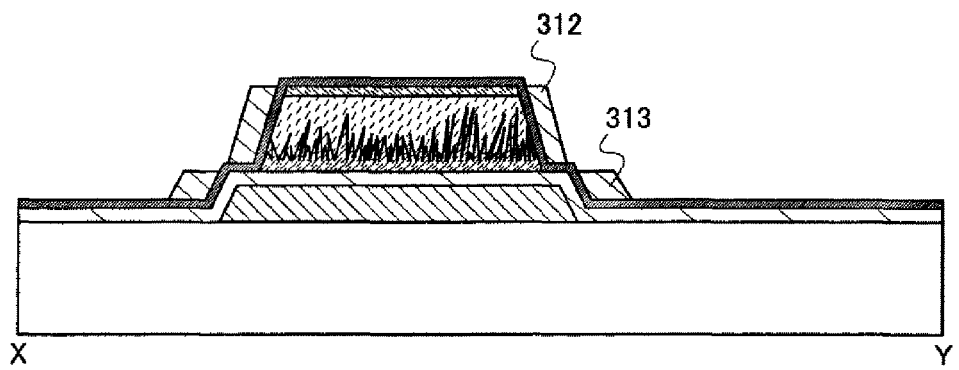

Next, the silicon oxynitride film 412 is etched, so that an upper sidewall insulating layer 312 and a lower sidewalk insulating layer 313 are formed (FIG. 10B). Here, a highly anisotropic etching method is employed. That is, etching is performed so that the thickness of the silicon oxynitride film 412 is reduced uniformly in a direction perpendicular to a surface of a substrate 300. In this embodiment, etching is performed until the silicon nitride film 413 is exposed.

Etching of the silicon oxynitride film 412 is preferably performed under such conditions that the etching rate with respect to that of the silicon nitride film 413 is low, and the etching rate with respect to that of the silicon oxynitride film 412 is high. For example, the etching may be performed using inductively coupled plasma (ICP) which is generated using a mixed gas of $C_4F_8$ and Ar under a bias voltage applied. Alternatively, a mixed gas of $CHF_3$ and He may be used.

Figure 10C:
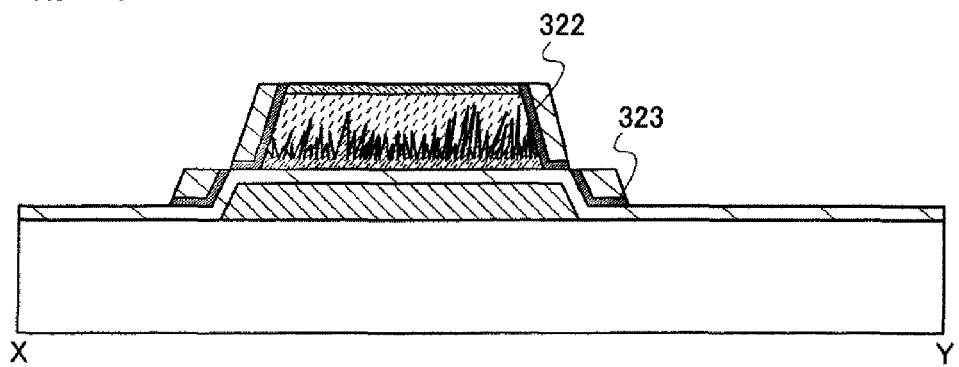

Next, the silicon nitride film 413 is etched, so that an upper base sidewalk insulating layer 322 and a lower base sidewall insulating layer 323 are formed (FIG. 10C). The subsequent steps are similar to those of Embodiment 2.

Etching of the silicon nitride film 413 is preferably performed under such conditions that the etching rate with respect to that of the silicon oxynitride film 412 is low, and the etching rate with respect to that of the silicon nitride film 413 is high. For example, dry etching may be performed using a mixed gas of $CHF_3$ and He as an etching gas. Alternatively, wet etching may be performed using diluted $H_3PO_4$ or concentrated $H_3PO_4$ as an etchant.

Thus, the sidewall insulating layer formed of a plurality of layers of different materials can be formed by forming a plurality of films of different materials and etching the material films.

In the formation of a sidewall insulating layer having a stacked structure as described in this embodiment, etching can be easily controlled. For example, even in the case of using a mother glass of the tenth generation (e.g., 2950 mm×3400 mm) as the substrate 300, variation in the thickness of the sidewall insulating layer over the substrate plane can be made small. Furthermore, in addition to the reduction of the variation in the thickness of the sidewall insulating layer, plasma damage to and a thickness reduction of the insulating layer 304 or the impurity semiconductor layer 410, which might be caused in the case where the sidewall insulating layer has a single-layer structure, can be reduced.

In this specification, "thickness reduction" refers to the phenomenon in which a layer or a film becomes thinner by the process such as etching.

Note that the structure of the sidewall insulating layer is not limited to the above-described combination of the silicon nitride film 413 and the silicon oxynitride film 412. The combination may be a combination of a silicon nitride film and a silicon oxide film, a combination of a silicon nitride oxide film and a silicon oxynitride film, or a combination of a silicon nitride oxide film and a silicon oxide film. It is preferable that the combination can ensure etching selectivity. That is, it is preferable that the etching rate of one of the insulating films with an etchant is higher or lower than the etching rate of the other of the insulating films with the etchant.

In the above-described manner, the TFT of Embodiment 3 can be manufactured.

Embodiment 5

In the TFTs and the manufacturing methods thereof described in Embodiments 1 to 4, a mode in which, in the region overlapping with a channel formation region, the second semiconductor layer remains and the remaining second semiconductor layer covers a portion overlapping with the channel formation region in the first semiconductor layer is employed. However, the present invention is not limited to the above mode and the first semiconductor layer may be exposed. In this embodiment, a mode in which, in a region overlapping with the channel formation region, the second semiconductor layer does not remain and the first semiconductor layer is exposed will be described.

Figure 11:
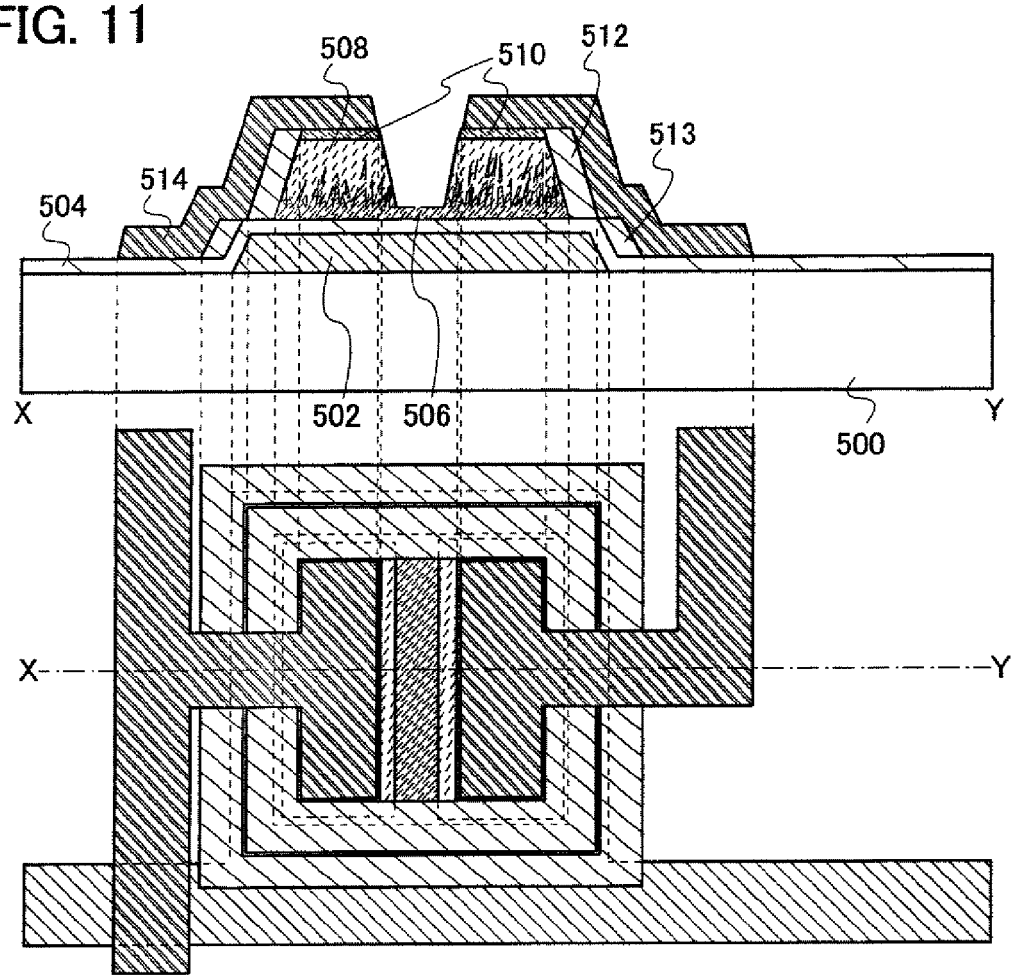
FIG. 11 illustrates a TFT of Embodiment 5.

That is, the TFT of this embodiment illustrated in FIG. 11 is provided over a substrate 500 and includes a first wiring layer 502, an insulating layer 504 provided so as to cover the first wiring layer 502, a first semiconductor layer 506 entirely overlapped with the first wiring layer 502, second semiconductor layers 508 provided apart from each other and in contact with the first semiconductor layer 506 and having a lower carrier mobility than the first semiconductor layer 506, impurity semiconductor layers 510 provided in contact with the second semiconductor layers 508, an upper sidewall insulating layer 512 provided so as to cover at least a sidewall of the first semiconductor layer 506, and second wiring layers 514 provided in contact with at least the impurity semiconductor layers 510. That is, the second semiconductor layers 508 are provided only in regions overlapping with the impurity semiconductor layers 510 over the first semiconductor layer 506. Further, a lower sidewall insulating layer 513 is provided over a step of the insulating layer 504, which is formed due to the first wiring layer 502.

In the case where the second semiconductor layers 508 are provided only in regions overlapping with the impurity semiconductor layers 510 over the first semiconductor layer 506, field-effect mobility and on-state current of the TFT can be increased.

Further, when an additional gate electrode is formed in a region overlapping with the channel formation region as later described in Embodiment 9, field-effect mobility and on-state current of the TFT can be controlled easily and increased significantly.

The other structures are similar to those of Embodiments 1 and 3.

The TFT of this embodiment may be combined with the TFT described in Embodiment 3. That is, the upper sidewall insulating layer 512 of the TFT of this embodiment may be formed by stacking a plurality of layers of different materials.

Such a sidewall insulating layer can be formed in a manner described in Embodiment 4.

Embodiment 6

In this embodiment, an example of a manufacturing method of a TFT, which is an embodiment of the present invention, will be described. Specifically, a manufacturing method of the TFT described in Embodiment 5 will be described. Note that portions that are the same as those of Embodiment 5 are generally denoted by the same reference numerals.

In the TFT described in Embodiment 5, the second semiconductor layers are provided only in regions overlapping with the impurity semiconductor layers over the first semiconductor layer.

Figure 12A:
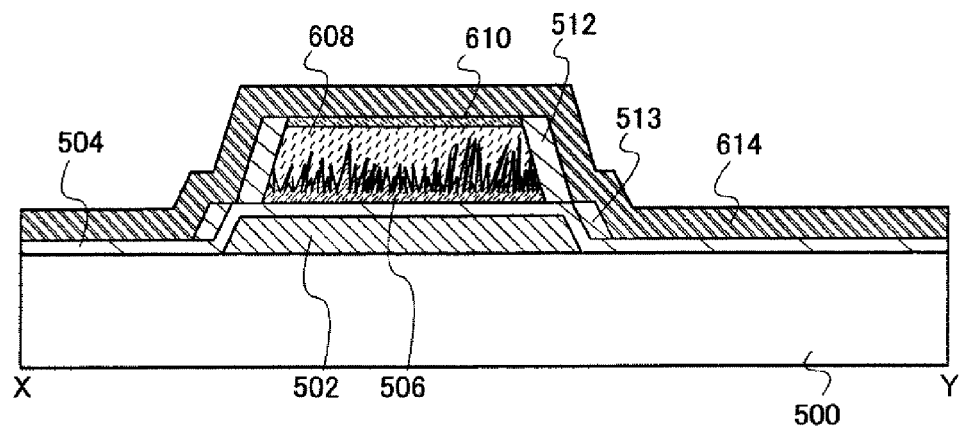
FIGS. 12A to 12C illustrate a manufacturing method of the TFT illustrated in FIG. 11.

First, a state similar to that illustrated in FIG. 8A of Embodiment 2 is formed. That is, after an upper sidewall insulating layer 512 and a lower sidewall insulating layer 513 are provided, a conductive film 614 is formed so as to cover a first semiconductor layer 506, a second semiconductor layer 608, and an impurity semiconductor layer 610 (FIG. 12A).

Figure 12B:
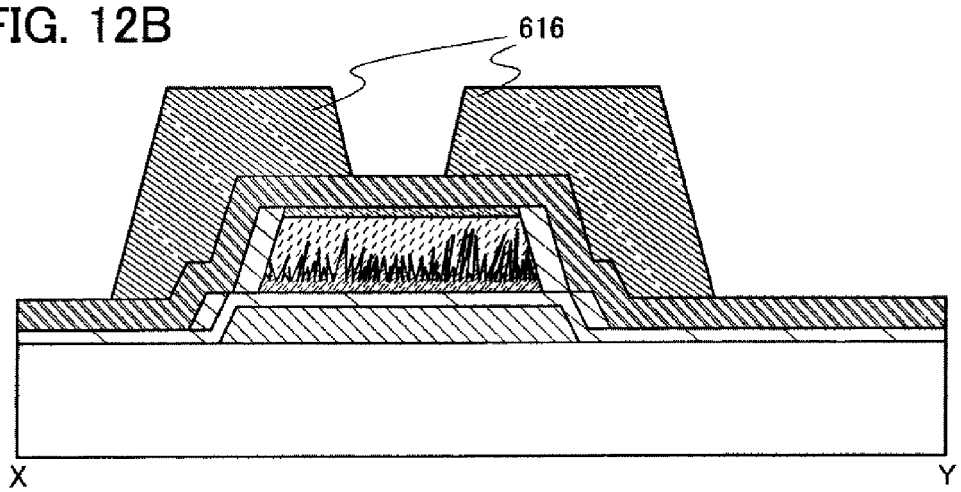

Next, a resist mask 616 is formed over the conductive film 614 (FIG. 12B).

Figure 12C:
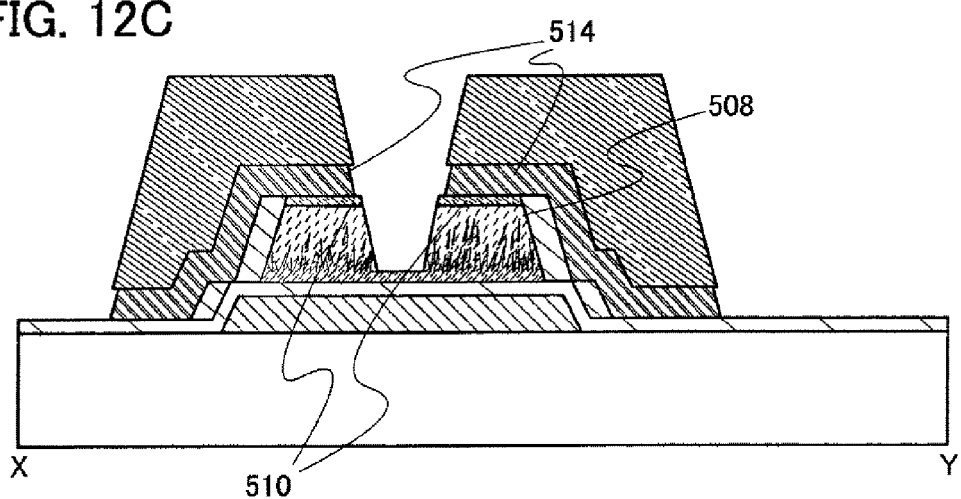

Then, the conductive film 614, the impurity semiconductor layer 610, and the second semiconductor layer 608 are processed using the resist mask 616, so that second wiring layers 514, impurity semiconductor layers 510, and second semiconductor layers 508 are formed (FIG. 12C). Here, processing is performed until the first semiconductor layer 506 is exposed; thus, the second semiconductor layers 508 are provided apart from each other.

This processing for exposing the first semiconductor layer 506 may be performed by a single etching step or a plurality of etching steps. For example, after the conductive film 614 and the impurity semiconductor layer 610 are etched, the second semiconductor layer 608 may be etched.

In the case of employing wet etching in order to etch the second semiconductor layer 608, $N_2H_4$ can be used as an etchant, for example. Further, an etchant containing KOH or $NH_2CH_2CH_2NH_2$ may be used. Alternatively, an etchant containing HF and $HNO_3$ can be used. Further alternatively, a tetramethyl ammonium hydroxide (also referred to as TMAH) aqueous solution may be used.

In the case of employing dry etching, a gas containing hydrogen may be used as a source gas, for example. Alternatively, a gas containing chlorine, bromine, or iodine may be used, or a gas containing HCl, HBr, HI, or the like may be used. A gas containing $CF_4$, $SF_6$, $NF_3$, $SiF_4$, $BF_3$, $XeF_2$, $ClF_3$, $SiCl_4$, $PCl_3$, $BCl_3$, or the like can be used. Further, a mixed gas of $CF_4$ and $O_2$ or a mixed gas of $SF_6$ and $Cl_2$ can be used.

In the above-described manner, the TFT of Embodiment 5 can be manufactured.

Embodiment 7

Although the "layer containing an amorphous semiconductor" is used as the second semiconductor layer in the TFTs and the manufacturing methods thereof described in Embodiments 1 to 6, the present invention is not limited thereto. The second semiconductor layer may be an amorphous semiconductor layer.

Figure 13:
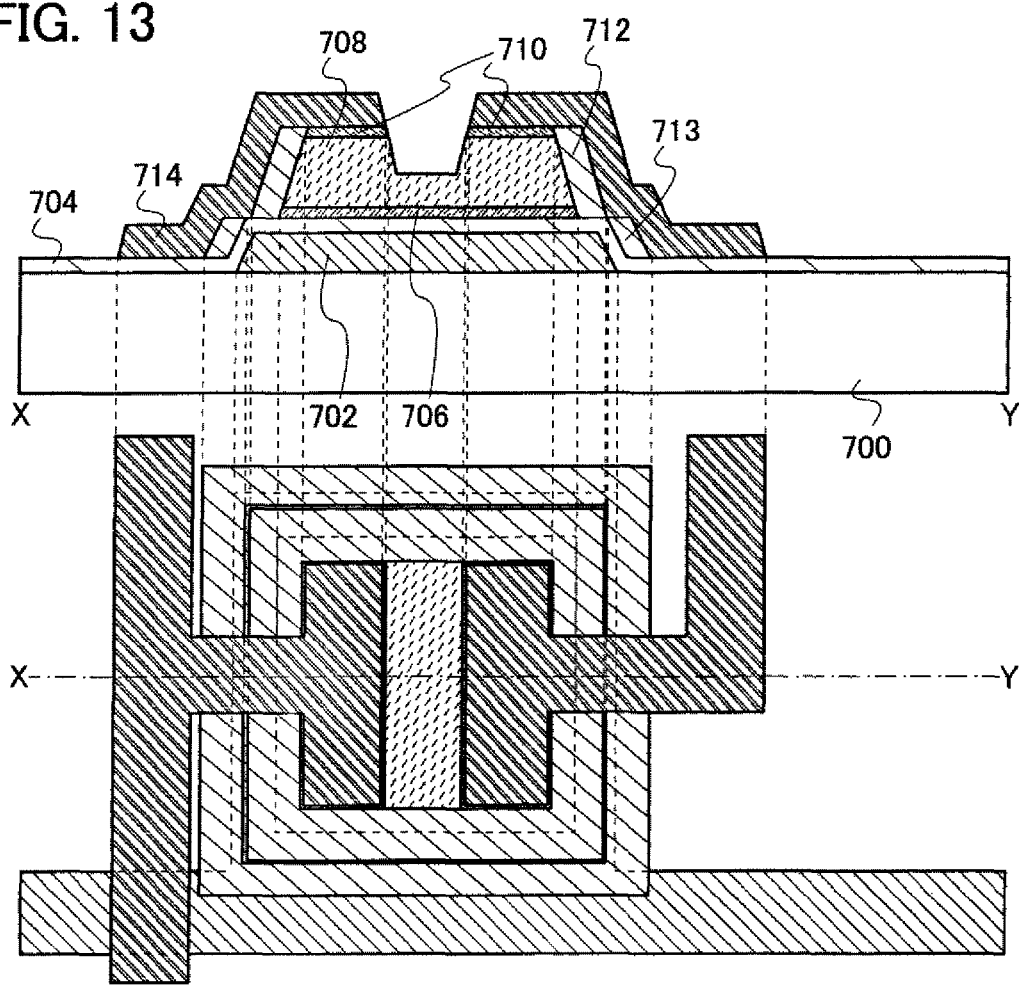
FIG. 13 illustrates a TFT of Embodiment 7.

The TFT of this embodiment illustrated in FIG. 13 is provided over a substrate 700 and includes a first wiring layer 702, an insulating layer 704 provided so as to cover the first wiring layer 702, a first semiconductor layer 706 entirely overlapped with the first wiring layer 702, a second semiconductor layer 708 provided over and in contact with the first semiconductor layer 706 and having a lower carrier mobility than the first semiconductor layer 706, an impurity semiconductor layer 710 provided in contact with the second semiconductor layer 708, an upper sidewall insulating layer 712 provided so as to cover at least a sidewall of the first semiconductor layer 706, and a second wiring layer 714 provided in contact with at least the impurity semiconductor layer 710. Here, the second semiconductor layer 708 has a feature of being an amorphous semiconductor layer. Further, a lower sidewall insulating layer 713 is provided over a step of the insulating layer 704, which is formed due to the first wiring layer 702.

Even in the case where the second semiconductor layer 708 is an amorphous semiconductor layer, off-state current can be sufficiently small.

The other structures are similar to those of Embodiment 1.

The TFT of this embodiment may be combined with the TFT described in Embodiment 3. That is, the upper sidewall insulating layer 712 of the TFT of this embodiment may be formed by stacking a plurality of layers of different materials. Such a sidewall insulating layer can be formed in a manner described in Embodiment 4.

The TFT of this embodiment may be combined with the TFT described in Embodiment 5. That is, a portion that is to serve as a channel formation region in the first semiconductor layer 706 may be exposed in the TFT of this embodiment. Such a TFT can be manufactured in a manner described in Embodiment 6.

As described above, the TFT of this embodiment can be implemented in combination with any of the TFTs of the other embodiments as appropriate.

Embodiment 8

In this embodiment, an example of a manufacturing method of a TFT, which is an embodiment of the present invention, will be described. Specifically, a manufacturing method of the TFT described in Embodiment 7 will be described. Note that portions that are the same as those of Embodiment 7 are generally denoted by the same reference numerals.

In the TFT described in Embodiment 7, a second semiconductor film 802 to be processed into the second semiconductor layer 708 is foliated of an amorphous semiconductor. In order to form the second semiconductor layer 708 of an amorphous semiconductor, a general formation method of an amorphous semiconductor may be employed. That is, the second semiconductor film 802 may be formed under such conditions as not to generate a crystal nucleus. Such conditions as not to generate a crystal nucleus in formation of the semiconductor film can be set by lowering the dilution ratio of silane, for example.

Figure 14A:
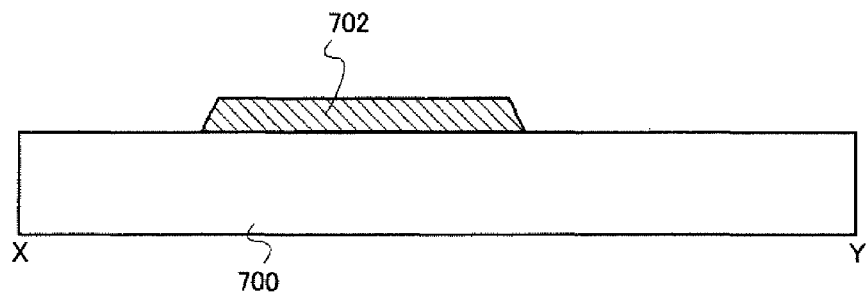
FIGS. 14A to 14C illustrate a manufacturing method of the TFT illustrated in FIG. 13.

First, a first wiring layer 702 is formed over a substrate 700 (FIG. 14A). The first wiring layer 702 may be formed in such a manner that a conductive material film is formed over an entire surface of the substrate 700 by a CVD method or a sputtering method and is processed by a photolithography method.

Figure 14B:
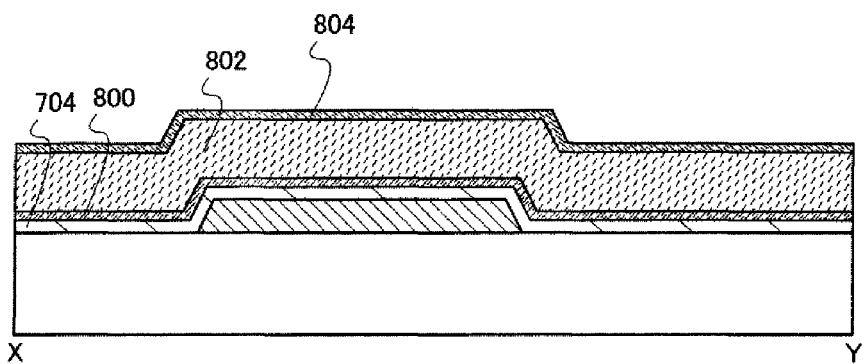

Next, an insulating layer 704 is formed so as to cover the first wiring layer 702. A first semiconductor film 800, a second semiconductor film 802, and an impurity semiconductor film 804 are formed over the insulating layer 704 (FIG. 14B).

The first semiconductor film 800 may be formed using a material and a method similar to those of the first semiconductor film 200 of Embodiment 2.

The second semiconductor film 802 can be formed by lowering the ratio of the flow rate of a dilution gas with respect to that of the deposition gas compared to the ratio of a gas used for forming the first semiconductor film 800. For example, the flow rate of a dilution gas is 1 time to 10 times, preferably 1 time to 5 times the flow rate of the deposition gas.

The impurity semiconductor film 804 can be formed using a material and a method similar to those of the impurity semiconductor film 204 of Embodiment 2.

Figure 14C:
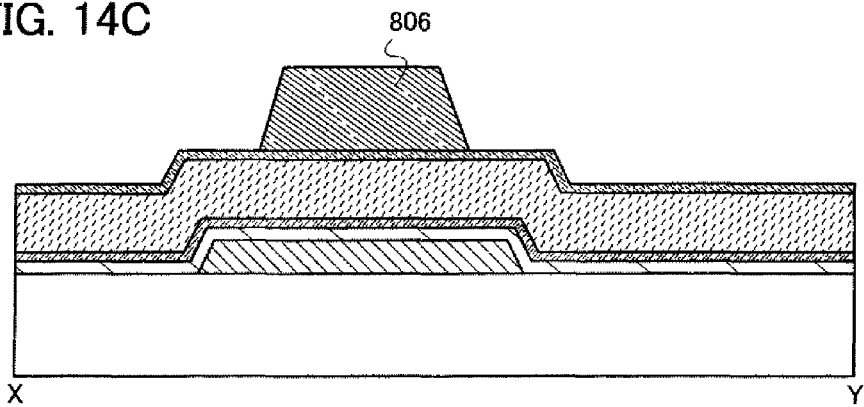

Next, a resist mask 806 is formed over the impurity semiconductor film 804 (FIG. 14C). The subsequent steps are similar to those of Embodiment 2.

In the above-described manner, the TFT of Embodiment 7 can be manufactured.

Embodiment 9

The TFTs and the manufacturing methods thereof described in Embodiments 1 to 8 can be applied to array substrates of display devices. In this embodiment, an array substrate including the TFT described in Embodiment 1 and a manufacturing method thereof will be described as an example, and further a display device and a manufacturing method thereof will be also described.

Figure 15A:
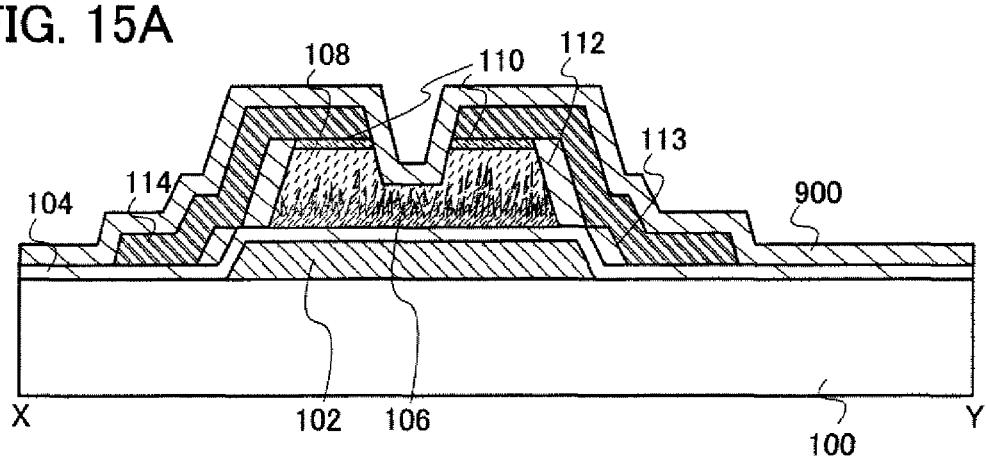
FIGS. 15A to 15C illustrate an example of a manufacturing method of an array substrate of a display device.

First, an insulating film 900 is formed so as to cover the TFT of FIG. 1. (FIG. 15A).

The insulating film 900 may be formed using an insulating material (e.g., silicon nitride, silicon nitride oxide, silicon oxynitride, silicon oxide, or the like). The insulating film 900 may have a single-layer structure or a stacked structure of plural layers. Here, the insulating film 900 is formed using silicon nitride, for example.

Figure 15B:
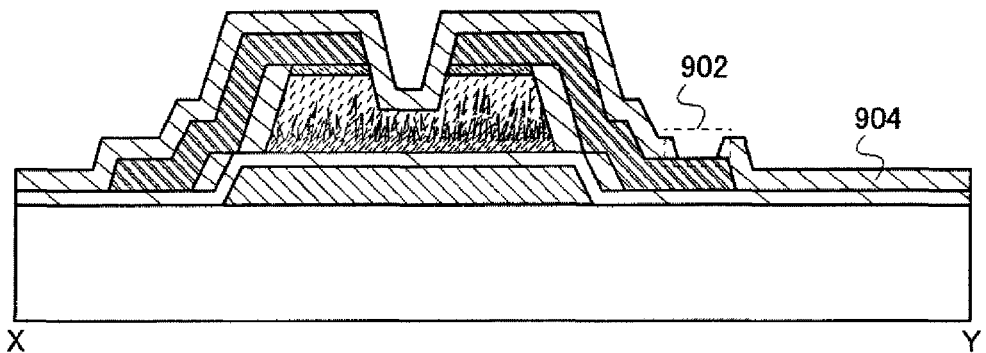

Then, an opening portion 902 is formed in the insulating film 900 so as to reach a second wiring layer 114; thus, an insulating layer 904 is formed (FIG. 15B). The opening portion 902 may be formed by a photolithography method.

In the case where the opening portion 902 has already been formed, for example, by forming the insulating film 900 by an ink-jet method, a further step of forming the opening portion 902 is not needed.

Figure 15C:
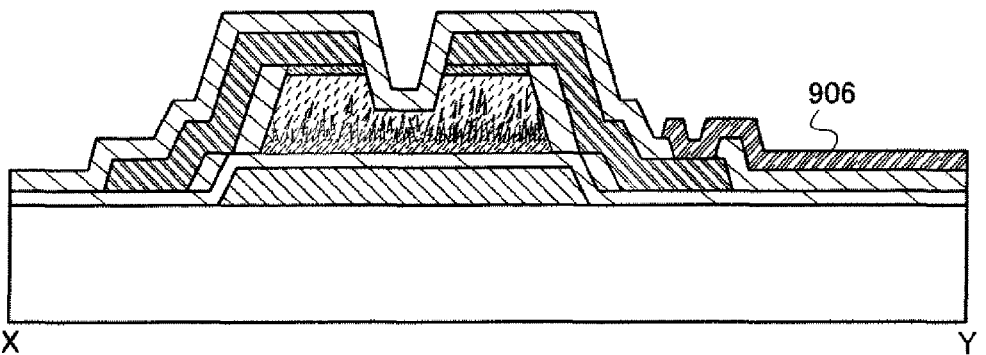

Next, a pixel electrode layer 906 is formed so as to connect to the second wiring layer 114 through the opening portion 902 (FIG. 15C).

The pixel electrode layer 906 can be formed using a conductive composition including a conductive high molecule (also referred to as a conductive polymer) having a light-transmitting property. The pixel electrode layer 906 formed using such a conductive composition preferably has a sheet resistance of 10000 ohms per square or less and a light transmittance of 70% or higher at a wavelength of 550 nm. Further, the resistivity of the conductive high molecule included in the conductive composition is preferably less than or equal to 0.1 Ω·cm.

As the conductive high molecule, a so-called π-electron conjugated conductive high molecule can be used. For example, polyaniline and a derivative thereof, polypyrrole and a derivative thereof; polythiophene and a derivative thereof, and a copolymer of two or more of these materials can be given.

The pixel electrode layer 906 can be formed using, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

The pixel electrode layer 906 may be formed by processing a film that is formed using any of the above-described material by a photolithography method.

Although not illustrated, an insulating layer formed using an organic resin by a spin coating method or the like may be provided between the insulating layer 904 and the pixel electrode layer 906.

Using the active matrix substrate in the state where the formation of the pixel electrode layer 906 has finished in the above-described manner, a display device can be manufactured.

By the way, an additional gate electrode may be formed from the pixel electrode layer in a region overlapping with the channel formation region. By provision of the additional gate electrode overlapping with the channel formation region, field-effect mobility and on-state current of the TFT can be increased. In particular, in the case of providing the additional gate electrode for the TFT of FIG. 11 described in Embodiment 5, field-effect mobility and on-state current of the TFT can be increased significantly. This is because the distance between the additional gate electrode and the semiconductor layer serving as the channel formation region is short.

Figure 16:
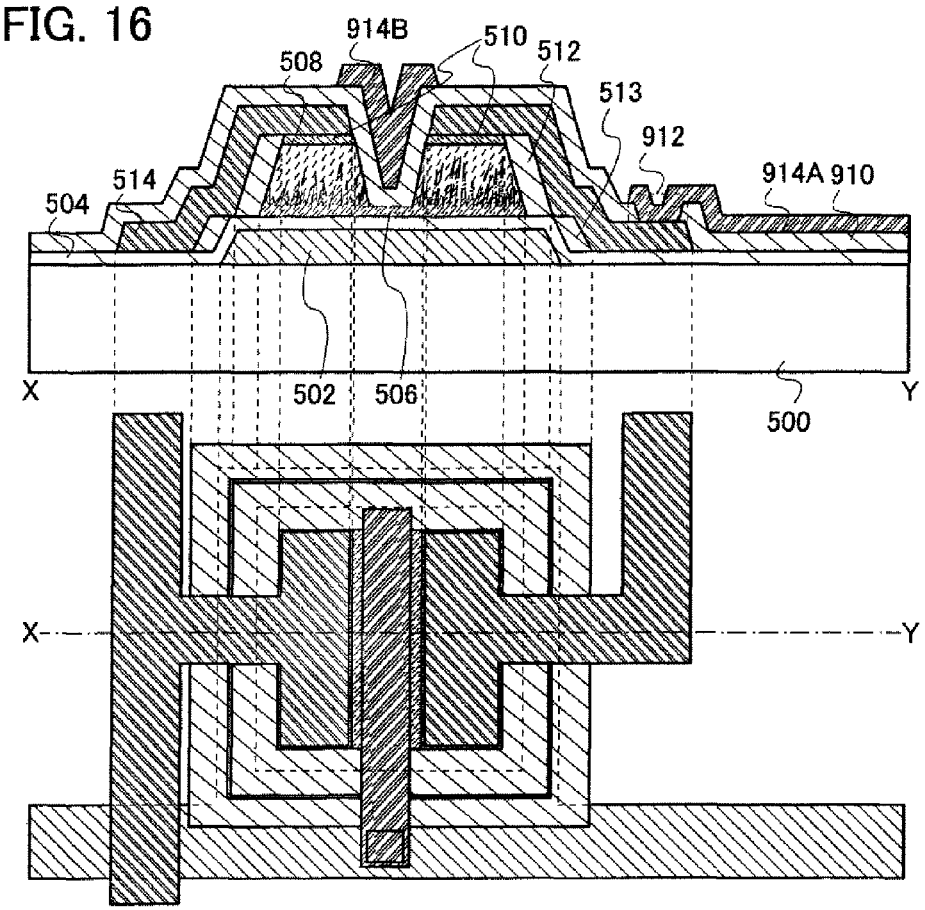
FIG. 16 illustrates an example of a TFT which is provided in an array substrate of a display device.

A mode in which the additional gate electrode is provided for the TFT of FIG. 11 is illustrated in FIG. 16. The TFT illustrated in FIG. 16 is provided over a substrate 500 and includes a first wiring layer 502, a first insulating layer 504 provided so as to cover the first wiring layer 502, a first semiconductor layer 506 entirely overlapped with the first wiring layer 502, second semiconductor layers 508 provided apart from each other over and in contact with the first semiconductor layer 506 and having a lower carrier mobility than the first semiconductor layer 506, impurity semiconductor layers 510 provided in contact with the second semiconductor layers 508, an upper sidewall insulating layer 512 provided so as to cover at least a sidewall of the first semiconductor layer 506, and second wiring layers 514 provided in contact with at least the impurity semiconductor layers 510. The TFT is covered with an insulating layer 910, and the insulating layer 910 includes an opening portion 912. A portion 914A functioning as a pixel electrode in a pixel electrode layer 914 which is provided over the insulating layer 910 is connected to the second wiring layer 514 through the opening portion 912. A portion 914B functioning as an additional gate electrode in the pixel electrode layer 914 which is provided over the insulating layer 910 is provided so as to overlap with the channel formation region of the first semiconductor layer 506.

In FIG. 16, the insulating layer 910 functions as a gate insulating layer of the additional gate electrode which is the portion 914B. The insulating layer 910 is preferably formed using the same material as the first insulating layer 504 with a thickness approximately the same as that of the first insulating layer 504.

Although the gate electrode formed of the first wiring layer 502 and the "additional gate electrode" formed of the portion 914B have the same potential in FIG. 16, the present invention is not limited thereto. A wiring that is connected to the "additional gate electrode" may be provided independently so that the potential of the "additional gate electrode" is different from that of the gate electrode formed of the first wiring layer 502.

The TFT illustrated in FIG. 16 can have an especially high electric field mobility and a significantly large on-state current. Accordingly, favorable switching characteristics can be obtained. The display device including such a TFT can have a high contrast ratio. As the display device, a liquid crystal display device and an EL display device can be given.

The liquid crystal display device can be manufactured by subjecting the above-described active matrix substrate to a cell process and a module process. An example of the cell process and the module process will be described below.

In the cell process, the active matrix substrate manufactured in the above-described process and a substrate opposite to the active matrix substrate (hereinafter referred to as a counter substrate) are attached to each other and liquid crystal is injected. First, a manufacturing method of the counter substrate will be briefly described below.

First, a light-blocking layer is formed over a substrate; a color filter layer of any of red, green, and blue is formed over the light-blocking layer; a counter electrode layer is formed over the color filter layer; and then, a rib is formed over the counter electrode layer.

As the light-blocking layer, a film of a material having a light-blocking property is selectively formed. As the material having a light-blocking property, for example, an organic resin containing a black resin (carbon black) or a material containing chromium as its main component (chromium, chromium oxide, or chromium nitride) can be used. In order to selectively form the film of a material having a light-blocking property, a photolithography method or the like may be employed.

The color filter layer may be selectively formed by selective formation of color materials using materials which transmits only light with any of red, green, and blue when being irradiated with white light. The arrangement of the color filter may be a stripe arrangement, a delta arrangement, or a square arrangement.

The counter electrode layer over the counter substrate can be formed over an entire surface over the counter substrate, using a material and a method similar to those of the pixel electrode layer included in the active matrix substrate.

The rib over the counter electrode layer is provided in order to widen the viewing angle and is selectively formed using an organic resin material. The rib may be formed as appropriate, if necessary.

After the formation of the color filter layer and before the formation of the counter electrode layer, an overcoat layer may be formed. By formation of the overcoat layer, planarity of a surface on which the counter electrode layer is formed can be improved, and part of a material included in the color filter layer can be prevented from entering a liquid crystal material. For the overcoat layer, a thermosetting material containing acrylic resin or epoxy resin as a base is used.

Further, before or after formation of the rib, a post spacer (columnar spacer) may be formed as a spacer. In the case of using a bead spacer (spherical spacer), the post spacer need not be formed.

Next, an alignment film is formed on the active matrix substrate and the counter substrate. The alignment film is formed, for example, in such a manner that a polyimide resin or the like is melted in an organic solvent; this solution is applied by a printing method, a spin coating method, or the like; and then the organic solvent is distilled off and the substrate is baked. Rubbing treatment is preferably performed on the alignment film to align liquid crystal molecules with a certain pretilt angle. The rubbing treatment may be performed, for example, by rubbing an alignment film with a shaggy cloth of velvet or the like.

Then, the active matrix substrate and the counter substrate are attached with a sealant. In the case of using a bead spacer, a bead spacer may be dispersed in a desired region and then attachment may be performed.

Next, a liquid crystal material is injected in a space between the active matrix substrate and the counter substrate, which are attached to each other. After injection of the liquid crystal material, an inlet for injection is sealed with an ultraviolet curing resin or the like. Alternatively, after dropping a liquid crystal material on one of the active matrix substrate and the counter substrate, these substrates may be attached to each other.

Next, a polarizing plate is attached to both surfaces of a liquid crystal cell, which is formed by attachment of the active matrix substrate and the counter substrate. Then, the cell process is finished.

Next, as the module process, a flexible printed circuit (FPC) is connected to an input terminal of a terminal portion. The FPC has a wiring formed using a conductive film over an organic resin film of polyimide or the like, and is connected to the input terminal through an anisotropic conductive paste (ACP). The ACP includes a paste serving as an adhesive and particles plated with gold or the like to have a conductive surface, which have a diameter of several tens of micrometers to several hundreds of micrometers. When the particles mixed in the paste are in contact with the conductive layer over the input terminal and in contact with the conductive layer over the terminal connected to the wiring formed in the FPC, electric connection therebetween is achieved. Alternatively, after connection of the FPC, a polarizing plate may be attached to the active matrix substrate and the counter substrate.

In the above-described manner, a liquid crystal display device can be manufactured.

A liquid crystal exhibiting a blue phase may be used as the liquid crystal material. A blue phase is one of liquid crystal phases, which is generated just before a cholesteric phase changes into an isotropic phase while the temperature of cholesteric liquid crystal is increased. Since the blue phase is only generated within a narrow range of temperature, a liquid crystal composition containing a chiral agent at 5 wt % or more is used in order to improve the temperature range. The liquid crystal composition containing a liquid crystal material exhibiting a blue phase and a chiral agent has a short response time of 10 μsec to 100 μsec inclusive and is optically isotropic; therefore, alignment treatment is not necessary and viewing angle dependence is small.

Further, the display device of this embodiment may be an EL display device. In the case where the display device of this embodiment is an EL display device, an EL layer may be formed over the pixel electrode layer 906, and another pixel electrode layer may be formed over the EL layer.

Since the pixel electrode layer 906 formed in the above-described manner can serve as an anode, a material of the other pixel electrode layer serving as a cathode may be a material having a low work function (e.g., Ca, Al, MgAg, or AlLi).

The EL layer may be a single-layer film or a stacked-layer film in which a plurality of layers is stacked. The EL layer includes at least a light-emitting layer. It is preferable that the light-emitting layer be connected to the other pixel electrode layer through a hole transport layer.

The EL display device of this embodiment may have any of a top emission structure, a bottom emission structure, or a dual emission structure.

Although the array substrate including the TFT of Embodiment 1 has been described in this embodiment, the present invention is not limited to this mode. An array substrate may include any of the TFTs of Embodiments 3, 5, and 7.

Embodiment 10

The TFTs and the display devices of the above embodiments can be applied to a variety of electronic devices (including game machines). Examples of such electronic devices are television devices (also referred to as televisions or television receivers), monitors for computers, electronic paper, cameras such as digital cameras or digital video cameras, digital photo frames, mobile phones (also referred to as cellular phones or mobile phone devices), portable game consoles, portable information terminals, audio playback devices, large-sized game machines such as Japanese pinball machines, and the like.

The display device described in the above embodiment can be applied to electronic paper, for example. Electronic paper can be used for electronic devices of a variety of fields for displaying information. For example, electronic paper can be used for electronic book readers (e-books), posters, advertisements in vehicles such as trains, displays of a variety of cards such as credit cards, and so on.

FIG. 17A illustrates an example of an electronic book reader. The electronic book reader illustrated in FIG. 17A includes a housing 1000 and a housing 1001. The housing 1000 and the housing 1001 are combined with a hinge 1004 so that the electronic book reader can be opened and closed. With such a structure, the electronic book reader can be handled like a paper book.

A display portion 1002 and a display portion 1003 are incorporated in the housing 1000 and the housing 1001, respectively. The display portion 1002 and the display portion 1003 may display one image or different images. In the structure where different images are displayed on different display portions, for example, the right display portion (the display portion 1002 in FIG. 17A) can display text and the left display portion (the display portion 1003 in FIG. 17A) can display graphics. Any of the display devices described in the above embodiment can be applied to the display portion 1002 and the display portion 1003.

In FIG. 17A, the housing 1000 is provided with a power input terminal 1005, operation keys 1006, a speaker 1007, and the like. The operation keys 1006 may have a function of turning pages, for example. Note that a keyboard, a pointing device, or the like may also be provided on the surface of the housing, on which the display portion is provided. Furthermore, an external connection terminal (an earphone terminal, a USB terminal, a terminal that can be connected to various cables such as a USB cable, or the like), a recording medium insertion portion, and the like may be provided on the back surface or the side surface of the housing. Further, the electronic book reader illustrated in FIG. 17A may further have a structure capable of wirelessly transmitting and receiving data.

FIG. 17B illustrates an example of a digital photo frame. In the digital photo frame of FIG. 17B, a display portion 1012 is incorporated in a housing 1011. Any of the display devices described in the above embodiment can be applied to the display portion 1012.

Note that the digital photo frame illustrated in FIG. 17B may be provided with an operation portion, an external connection terminal (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame. For example, a memory that stores image data taken with a digital camera is inserted into the recording medium insertion portion of the digital photo frame and the data is loaded, whereby the image can be displayed on the display portion 1012. The digital photo frame illustrated in FIG. 17B may have a structure capable of wirelessly transmitting and receiving data.

FIG. 17C illustrates an example of the television device. In the television device illustrated in FIG. 17C, a display portion 1022 is incorporated in a housing 1021, and the housing 1021 is supported by a stand 1023. Any of the display devices described in the above embodiment can be applied to the display portion 1022.

The television device illustrated in FIG. 17C can be operated with an operation switch of the housing 1021 or a separate remote controller. Channels and volume can be controlled with an operation key of the remote controller so that an image displayed on the display portion 1022 can be selected. Further, the remote controller may be provided with a display portion for displaying data output from the remote controller.

The television device illustrated in FIG. 17C may be provided with a receiver, a modem, and the like. With the receiver, a general television broadcast can be received. Further, when the television device is connected to a communication network by wired or wireless connection via the modem, one-way (from a transmitter to a receiver) or two-way (between a transmitter and a receiver, between receivers, or the like) data communication can be performed.

FIG. 17D illustrates an example of the mobile phone. The mobile phone illustrated in FIG. 17D is provided with a display portion 1032 incorporated in a housing 1031, an operation button 1033, an operation button 1037, an external connection port 1034, a speaker 1035, a microphone 1036, and the like. Any of the display devices described in the above embodiment can be applied to the display portion 1032.

In the mobile phone illustrated in FIG. 17D, the display portion 1032 may be a touch panel. In the case where the display portion 1032 is a touch panel, operations such as making calls and composing mails can be performed by using the display portion 1032 as a touch panel.

There are mainly three screen modes of the display portion 1032. The first mode is a display mode mainly for displaying images. The second mode is an input mode mainly for inputting information such as text. The third mode is a display/input mode in which two modes of the display mode and the input mode are combined.

For example, in the case of making calls or composing mails, a text input mode mainly for inputting text is selected for the display portion 1032 so that text displayed on a screen can be input. In that case, it is preferable to display a keyboard or number buttons on almost the entire screen of the display portion 1032.

When a detection device including a sensor for detecting inclination, such as a gyroscope or an acceleration sensor, is provided inside the mobile phone illustrated in FIG. 17D, data displayed on the display portion 1032 can be automatically switched by detecting the orientation of the mobile phone (whether the mobile phone is placed horizontally or vertically for a landscape mode or a portrait mode).

Further, the screen modes may be switched by touching the display portion 1032 or operating the operation button 1037 of the housing 1031. Alternatively, the screen modes may be switched depending on the kinds of image displayed on the display portion 1032.

Further, in the input mode, a signal is detected by an optical sensor in the display portion 1032 and if input by touching the display portion 1032 is not performed for a certain period of time, the screen mode may be controlled so as to be switched from the input mode to the display mode.

The display portion 1032 can also function as an image sensor. For example, an image of a palm print, a fingerprint, or the like is taken when the display portion 1032 is touched with the palm or the finger, whereby personal authentication can be performed. Moreover, when a backlight or sensing light source which emits near-infrared light is provided in the display portion, an image of finger veins, palm veins, or the like can be taken.

As described above, the TFTs and the display devices described in the above embodiments can be applied to a variety of electronic devices.

This application is based on Japanese Patent Application serial no. 2009-289802 filed with Japan Patent Office on Dec. 21, 2009, the entire contents of which are hereby incorporated by reference.

What is claimed is:

1. A manufacturing method of a thin film transistor, comprising the steps of:
    forming a first wiring layer;
    forming a gate insulating layer so as to cover the first wiring layer;
    forming a first semiconductor layer over the gate insulating layer overlapping with the first wiring layer,
    forming a second semiconductor layer having a lower carrier mobility than the first semiconductor layer over the first semiconductor layer,
    forming an impurity semiconductor layer over the second semiconductor layer;
    forming an insulating film so as to cover the first semiconductor layer, the second semiconductor layer and the impurity semiconductor layer;
    anisotropically etching the insulating film to expose the impurity semiconductor layer, so that a sidewall insulating layer covering at least a side surface of the first semiconductor layer is formed;
    forming a second wiring layer over the impurity semiconductor layer and the sidewall insulating layer; and
    etching part of the second semiconductor layer and part of the impurity semiconductor layer, so that a source region and a drain region are formed,
    wherein the part of the second semiconductor layer is etched so that the first semiconductor layer is exposed.

2. A manufacturing method of a thin film transistor, comprising the steps of:
    forming a first wiring layer;
    forming a gate insulating layer so as to cover the first wiring layer;
    forming a first semiconductor layer over the gate insulating layer overlapping with the first wiring layer,
    forming a second semiconductor layer having a lower carrier mobility than the first semiconductor layer over the first semiconductor layer,
    forming an impurity semiconductor layer over the second semiconductor layer;
    forming a first insulating film and a second insulating film so as to cover the first semiconductor layer, the second semiconductor layer and the impurity semiconductor layer;
    anisotropically etching the second insulating film to expose the first insulating film, so that a first sidewall insulating layer is formed;
    etching a portion of the first insulating film, which does not overlap with the first sidewall insulating layer, to expose the impurity semiconductor layer, so that a second sidewall insulating layer which, together with the first sidewall insulating layer, covers at least a side surface of the first semiconductor layer is formed;
    forming a second wiring layer over the impurity semiconductor layer and the second sidewall insulating layer; and
    etching part of the second semiconductor layer and part of the impurity semiconductor layer, so that a source region and a drain region are formed.

3. The manufacturing method of a thin film transistor according to claim 2,
    wherein the first sidewall insulating layer includes silicon nitride; and
    wherein the second sidewall insulating layer includes silicon oxide or silicon oxynitride.

4. The manufacturing method of a thin film transistor according to claim 2, wherein the part of the second semiconductor layer is etched so that the first semiconductor layer is exposed.

5. A thin film transistor comprising:
    a first wiring layer;
    a gate insulating layer over the first wiring layer;
    a first semiconductor layer over the first wiring layer with the gate insulating layer interposed therebetween, wherein an entire portion of the first semiconductor layer is overlapped with the first wiring layer;
    a second semiconductor layer provided over and in contact with the first semiconductor layer and having a lower carrier mobility than the first semiconductor layer;
    an impurity semiconductor layer in contact with the second semiconductor layer;
    a sidewall insulating layer covering at least a side surface of the first semiconductor layer, wherein the sidewall insulating layer contains a silicon oxide layer or a silicon oxynitride layer stacked over a silicon nitride layer; and
    a second wiring layer in contact with at least the impurity semiconductor layer.

6. The thin film transistor according to claim 5, wherein an additional wiring layer is provided so as to overlap with a portion serving as a channel formation region in the first semiconductor layer.

7. The thin film transistor according to claim 5, wherein another sidewall insulating layer is provided over a step of the gate insulating layer, which is formed due to a thickness of the first wiring layer.

8. The thin film transistor according to claim 5,
    wherein the first semiconductor layer is a microcrystalline semiconductor layer,
    wherein the second semiconductor layer includes an amorphous semiconductor and a microcrystalline semiconductor, and
    wherein a tip of a crystal grown from the first semiconductor layer reaches the second semiconductor layer.

9. The thin film transistor according to claim 5, wherein a distance from a surface of the sidewall insulating layer to a surface of the first semiconductor layer is more than 30 nm.

10. The thin film transistor according to claim 5, wherein side surfaces of the first semiconductor layer and the second semiconductor layer have a taper angle more than or equal to 60° and less than or equal to 90°.

11. The thin film transistor according to claim 5, wherein the sidewall insulating layer is formed by stacking a plurality of layers of different materials.

12. The thin film transistor according to claim 5, wherein the first wiring layer is wider than the first semiconductor layer.

13. The thin film transistor according to claim 5, wherein the thin film transistor is incorporated in one selected from the group consisting of an electronic book reader, a digital photo frame, a television device and a mobile phone.

14. A thin film transistor comprising:
a first wiring layer;
a gate insulating layer over the first wiring layer;
a first semiconductor layer over the first wiring layer with the gate insulating layer interposed therebetween, wherein an entire portion of the first semiconductor layer is overlapped with the first wiring layer;
second semiconductor layers provided apart from each other over and in contact with the first semiconductor layer and having a lower carrier mobility than the first semiconductor layer;
impurity semiconductor layers in contact with the second semiconductor layers;
a sidewall insulating layer covering at least a side surface of the first semiconductor layer, wherein the sidewall insulating layer contains a silicon oxide layer or a silicon oxynitride layer stacked over a silicon nitride layer; and
second wiring layers in contact with at least the impurity semiconductor layers.

15. The thin film transistor according to claim 14, wherein an additional wiring layer is provided so as to overlap with a portion serving as a channel formation region in the first semiconductor layer.

16. The thin film transistor according to claim 14, wherein another sidewall insulating layer is provided over a step of the gate insulating layer, which is formed due to a thickness of the first wiring layer.

17. The thin film transistor according to claim 14,
wherein the first semiconductor layer is a microcrystalline semiconductor layer,
wherein the second semiconductor layers include an amorphous semiconductor and a microcrystalline semiconductor, and
wherein a tip of a crystal grown from the first semiconductor layer reaches the second semiconductor layer.

18. The thin film transistor according to claim 14, wherein a distance from a surface of the sidewall insulating layer to a surface of the first semiconductor layer is more than 30 nm.

19. The thin film transistor according to claim 14, wherein side surfaces of the first semiconductor layer and the second semiconductor layer have a taper angle more than or equal to 60° and less than or equal to 90°.

20. The thin film transistor according to claim 14, wherein the sidewall insulating layer is formed by stacking a plurality of layers of different materials.

21. The thin film transistor according to claim 14, wherein the first wiring layer is wider than the first semiconductor layer.

22. The thin film transistor according to claim 14, wherein the thin film transistor is incorporated in one selected from the group consisting of an electronic book reader, a digital photo frame, a television device and a mobile phone.

\* \* \* \* \*